(12) United States Patent
Yang et al.

(10) Patent No.: US 9,467,165 B2
(45) Date of Patent: Oct. 11, 2016

(54) PHYSICAL LAYER ENCODING AND DECODING METHOD AND APPARATUSES THEREOF

(71) Applicant: HUAWEI TECHNOLOGIES CO.,LTD., Shenzhen, Guangdong (CN)

(72) Inventors: Wenbin Yang, Beijing (CN); Tongtong Wang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/055,947

(22) Filed: Feb. 29, 2016

(65) Prior Publication Data

US 2016/0182084 A1 Jun. 23, 2016

Related U.S. Application Data

(63) Continuation of application No. PCT/CN2014/081722, filed on Jul. 7, 2014.

(30) Foreign Application Priority Data

Aug. 30, 2013 (CN) .......................... 2013 1 0390805

(51) Int. Cl.
*H03M 7/30* (2006.01)
*H03M 13/15* (2006.01)
(Continued)

(52) U.S. Cl.
CPC ............ *H03M 7/30* (2013.01); *H03M 13/1515* (2013.01); *H03M 13/6312* (2013.01); *H04L 1/0057* (2013.01); *H04L 69/22* (2013.01)

(58) Field of Classification Search
CPC ............. H03M 7/30; H03M 13/6312; H03M 13/1515; H04L 69/22; H04L 1/0057
USPC .................................................... 341/87, 58
See application file for complete search history.

(56) References Cited

U.S. PATENT DOCUMENTS 7,302,631 B2 * 11/2007 Bansal .................. H04L 1/0041
714/758

(Continued)

FOREIGN PATENT DOCUMENTS

| CN | 101610134 A | 12/2009 |
| CN | 102497251 A | 6/2012 |

(Continued)

OTHER PUBLICATIONS

IEEE P802.3ba™D3.2, Draft Standard for Information technology—Telecommunications and information exchange between systems—Local and metropolitan area networks—Specific requirements Part 3: Carrier Sense Multiple Access with Collision Detection (CSMA/CD) Access Method and Physical Layer Specifications, Amendment: Media Access Control Parameters, Physical Layers and Management Parameters for 40 Gb/s and 100 Gb/s Operation, Mar. 24, 2010, total 461 pages.

(Continued)

*Primary Examiner* — Khai M Nguyen
(74) *Attorney, Agent, or Firm* — Huawei Technologies Co., Ltd.

(57) ABSTRACT

This application discloses a physical layer encoding and decoding method and apparatuses thereof, where the method includes: receiving an MII control block and a first 256-bit to-be-encoded block that are input; determining a control block in the first 256-bit to-be-encoded block, and compressing the determined control block; determining a physical layer encoding format, a value of a sync header, a hierarchy of a block type field, and a value of the block type field according to the MII control block; and obtaining an encoding result by means of mapping the compressed to-be-encoded block to data in a physical layer data format according to the determined physical layer encoding format, adding a sync header to the data, and adding, according to the hierarchy of the block type field, a block type field to space obtained by compression. This application may be used to meet a requirement of an RS-FEC algorithm.

35 Claims, 11 Drawing Sheets

(51) Int. Cl.
*H04L 1/00* (2006.01)
*H03M 13/00* (2006.01)
*H04L 29/06* (2006.01)

(56) References Cited

U.S. PATENT DOCUMENTS

| | | | |
|---|---|---|---|
| 7,627,023 B1 * | 12/2009 | Lo | H04L 69/22 375/222 |
| 7,707,475 B2 * | 4/2010 | Hoyer | H04L 25/4908 714/752 |
| 2009/0119571 A1 | 5/2009 | Hoyer | |

FOREIGN PATENT DOCUMENTS

| | | |
|---|---|---|
| CN | 103259610 A | 8/2013 |
| EP | 1133123 A2 | 9/2001 |

OTHER PUBLICATIONS

IEEE P802.3bj™/D2.2, Draft Standard for Ethernet Amendment X: Physical Layer Specifications and Management Parameters for 100 Gb/s Operation Over Backplanes and Copper Cables. Aug. 9, 2013, total 365 pages.

* cited by examiner

| Input Data | sync | Block Payload | | | | | | | |
|---|---|---|---|---|---|---|---|---|---|
| Bit Position / Data Block Format | 01 | 2 | | | | | | | 65 |
| $D_0D_1D_2D_3D_4D_5D_6D_7$ | 01 | $D_0$ | $D_1$ | $D_2$ | $D_3$ | $D_4$ | $D_5$ | $D_6$ | $D_7$ |
| Control Block Formats | | Block Type Field | | | | | | | |
| $C_0C_1C_2C_3C_4C_5C_6C_7$ | 10 | 0x1E | $C_0$ | $C_1$ | $C_2$ | $C_3$ | $C_4$ | $C_5$ | $C_6$ | $C_7$ |
| $S_0D_1D_2D_3D_4D_5D_6D_7$ | 10 | 0x78 | | $D_1$ | $D_2$ | $D_3$ | $D_4$ | $D_5$ | $D_6$ | $D_7$ |
| $O_0D_1D_2D_3Z_4Z_5Z_6Z_7$ | 10 | 0x48 | | $D_1$ | $D_2$ | $D_3$ | $O_0$ | 0x000_0000 | | |
| $T_0C_1C_2C_3C_4C_5C_6C_7$ | 10 | 0x87 | | $C_1$ | $C_2$ | $C_3$ | $C_4$ | $C_5$ | $C_6$ | $C_7$ |
| $D_0T_1C_2C_3C_4C_5C_6C_7$ | 10 | 0x99 | $D_0$ | | $C_2$ | $C_3$ | $C_4$ | $C_5$ | $C_6$ | $C_7$ |
| $D_0D_1T_2C_3C_4C_5C_6C_7$ | 10 | 0xAA | $D_0$ | $D_1$ | | $C_3$ | $C_4$ | $C_5$ | $C_6$ | $C_7$ |
| $D_0D_1D_2T_3C_4C_5C_6C_7$ | 10 | 0xB4 | $D_0$ | $D_1$ | $D_2$ | | $C_4$ | $C_5$ | $C_6$ | $C_7$ |
| $D_0D_1D_2D_3T_4C_5C_6C_7$ | 10 | 0xCC | $D_0$ | $D_1$ | $D_2$ | $D_3$ | | $C_5$ | $C_6$ | $C_7$ |
| $D_0D_1D_2D_3D_4T_5C_6C_7$ | 10 | 0xD2 | $D_0$ | $D_1$ | $D_2$ | $D_3$ | $D_4$ | | $C_6$ | $C_7$ |
| $D_0D_1D_2D_3D_4D_5T_6C_7$ | 10 | 0xE1 | $D_0$ | $D_1$ | $D_2$ | $D_3$ | $D_4$ | $D_5$ | | $C_7$ |
| $D_0D_1D_2D_3D_4D_5D_6T_7$ | 10 | 0xFF | $D_0$ | $D_1$ | $D_2$ | $D_3$ | $D_4$ | $D_5$ | $D_6$ | |

FIG. 1

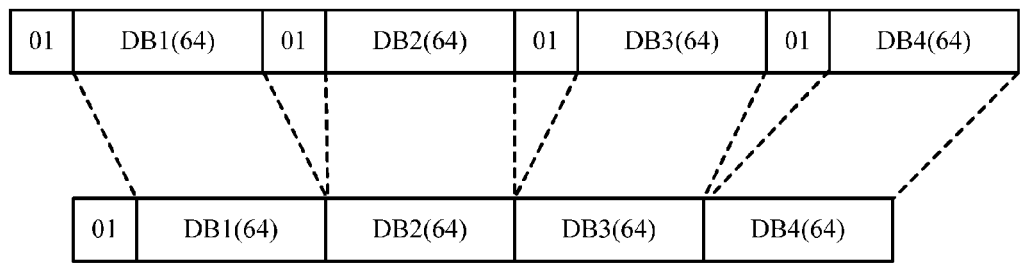

FIG. 2A

| syna | DATA | | | | | |
|---|---|---|---|---|---|---|
| synb | type 0 | DATA | | | | Control block |
| synb | type 1 | DATA | | | | Control block |
| synb | type 2 | DATA | | | | Control block |
| synb | type 3 | DATA | | | | Control block |
| synb | type 4 | Control block | DATA | | | |
| synb | type 5 | type T | DATA | | Control block | Control block |
| synb | type 6 | type T | DATA | | Control block | Control block |
| synb | type 7 | type T | DATA | Control block | Control block | DATA |
| synb | type 8 | type T | Control block | Control block | DATA | |
| synb | type a | type T | type A | DATA | Control block | Control block | Control block |
| synb | type a | type T | type B | Control block | Control block | Control block | DATA |
| synb | type a | Res | type C | Control block | Control block | Control block | Control block | Res |
| synb | type a | Res | type D | Control block | Control block | Control block | Control block | Res |

FIG. 3

| 0 | | | 4×64bit DATA | | | | |
|---|---|---|---|---|---|---|---|
| 1 | type0 | | 3×64bit DATA | | | $T_7$ block | |
| 1 | type1 | | 3×64bit DATA | | | $T_6$ block | |
| 1 | type2 | | 3×64bit DATA | | | $T_5$ block | |
| 1 | type3 | | 3×64bit DATA | | | $T_4$ block | |
| 1 | type4 | | 3×64bit DATA | | | $T_3$ block | |
| 1 | type5 | | 3×64bit DATA | | | $T_2$ block | |
| 1 | type6 | | 3×64bit DATA | | | $T_1$ block | |
| 1 | type7 | | 3×64bit DATA | | | $T_0$ block | |
| 1 | type8 | S block | | 3×64bit DATA | | | |
| 1 | type9 | typeT | 2×64bit DATA | | | T block | S block |
| 1 | typea | typeT | 2×64bit DATA | | | T block | C block |
| 1 | typeb | typeT | 64bit DATA | | T block | S block | 64bit DATA |
| 1 | typec | typeT | T block | | S block | 2×64bit DATA | |
| 1 | typed | typeT | typeA | 64bit DATA | T block | C block | S block |
| 1 | typed | typeT | typeB | 64bit DATA | T block | C block | C block |
| 1 | typed | typeT | typeC | T block | C block | S block | 64bit DATA |
| 1 | typed | typeT | typeD | T block | C block | C block | S block | Res |
| 1 | typed | typeT | typeE | T block | C block | C block | C block | Res |
| 1 | typed | Res | typeF | C block | C block | C block | C block | Res |
| 1 | typed | Res | typeG | O block | O block | O block | O block | Res |

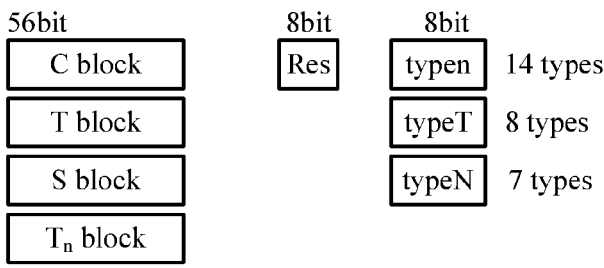

FIG. 4

| 01 | | | | | | | |
|---|---|---|---|---|---|---|---|
| | 4×64bit DATA | | | | | | |
| 10 | type0 | 3×64bit DATA | | | | $T_7$ block | |
| 10 | type1 | 3×64bit DATA | | | | $T_6$ block | |
| 10 | type2 | 3×64bit DATA | | | | $T_5$ block | |
| 10 | type3 | 3×64bit DATA | | | | $T_4$ block | |
| 10 | type4 | 3×64bit DATA | | | | $T_3$ block | |
| 10 | type5 | 3×64bit DATA | | | | $T_2$ block | |
| 10 | type6 | 3×64bit DATA | | | | $T_1$ block | |
| 10 | type7 | 3×64bit DATA | | | | $T_0$ block | |
| 10 | type8 | S block | 3×64bit DATA | | | | |
| 10 | type9 | Res | C block | S block | 2×64bit DATA | | |
| 10 | typea | typeT | T block | S block | 2×64bit DATA | | |
| 10 | typeb | typeT | 2×64bit DATA | | T block | S block | |
| 10 | typec | typeT | 2×64bit DATA | | T block | C block | |
| 10 | typed | typeT | 64bit DATA | T block | S block | 64bit DATA | |
| 10 | typee | typeT | typeA | 64bit DATA | T block | C block | S block |
| 10 | typee | typeT | typeB | 64bit DATA | T block | C block | C block |
| 10 | typee | typeT | typeC | T block | C block | S block | 64bit DATA |
| 10 | typee | typeT | typeD | T block | C block | C block | S block | Res |
| 10 | typee | typeT | typeE | T block | C block | C block | C block | Res |
| 10 | typee | Res | typeF | C block | C block | S block | 64bit DATA | |
| 10 | typee | Res | typeG | C block | C block | C block | S block | Res |
| 10 | typee | Res | typeH | C block | C block | C block | C block | Res |
| 10 | typee | Res | typeI | O block | O block | O block | O block | Res |

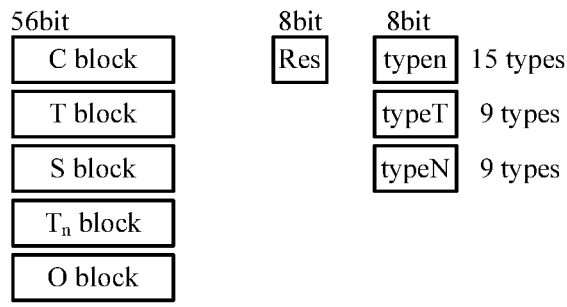

FIG. 5

PHYSICAL LAYER ENCODING AND DECODING METHOD AND APPARATUSES THEREOF

CROSS-REFERENCE TO RELATED APPLICATIONS

This application is a continuation of International Application No. PCT/CN2014/081722, filed on Jul. 7, 2014, which claims priority to Chinese Patent Application No. 201310390805.7, filed on Aug. 30, 2013, both of which are hereby incorporated by reference in their entireties.

TECHNICAL FIELD

The present invention relates to encoding and decoding technologies in the communications field, and in particular, to a physical layer encoding and decoding method and apparatuses thereof.

BACKGROUND

From top to bottom, a physical layer of a 100G Ethernet includes a PCS (Physical Coding Sublayer, physical coding sublayer), a PMA (Physical Medium Attachment, physical medium attachment) sublayer, and a PMD (Physical Media Dependent, physical media dependent) sublayer. The PCS is located between an RS (Reconciliation Sublayer, reconciliation sublayer) of a MAC (Media Access Control, media access control) layer and the PMA sublayer. An interface between the PCS and an upper-layer RS/MAC sublayer is provided by an XGMII (XG Media Independence Interface, media independent interface, where for the 100G Ethernet, "CGMII" is used to indicate 100G). The PCS is used to map one Ethernet MAC function to a function of an encoding physical layer signal system. Currently, the 100G Ethernet standard 802.3ba stipulates that PCS encoding uses 64B/66B encoding.

64B/66B encoding is used to perform encoding mapping on each character in eight pieces of 8-bit (8-bit) data and one 8-bit control signal that are transmitted through an XGMII, so as to generate a block payload (Block Payload), a sync header (sync header), and a block type field (Block Type Field); and use the three to generate a 66-bit block (Block) in a format and output the block. The block type field (Block Type Field) is used to ensure that a Hamming distance between 64-bit blocks is not less than 4.

FIG. 1 is a codeword conversion format table of 64B/66B encoding provided in the existing 802.3ba standard. $D_n$ indicates an 8-bit data block, $C_n$ indicates a control block (which has 8 bits before encoding and 7 bits after encoding), $O_0$ indicates an Order sequence (order sequence) indication, and $T_n$ indicates a location of packet trailer Terminate of a data packet. It can be seen that a 64-bit all-data block (that is, the 64-bit all-data block does not include a control block and can be represented as data blocks) cannot be compressed; and a 64-bit non-all-data block (that is, the 64-bit non-all-data block includes a control block and can be represented as control blocks) can be compressed into 56 bits, and the remaining 8 bits are used as Block Type Field space to ensure that a Hamming distance between 64-bit blocks, such as control information, for example, Terminate (terminate), Start (start), Order sequence (order sequence), and Control (control), is not less than 4.

As the 400G Ethernet standard is put forward, because technologies such as high-speed interfaces and high-order modulation are used, using an RS-FEC (Reed-Solomon Forward Error Correction, Reed-Solomon Forward Error Correction) scheme with a higher gain becomes a future development trend; however, a 64B/66B encoding method cannot meet a requirement of an RS-FEC algorithm.

SUMMARY

Embodiments of the present invention provide a physical layer encoding and decoding method and apparatuses thereof, which are used to meet a requirement of an RS-FEC algorithm.

According to a first aspect, an encoding method is provided, including:

receiving a media independent interface MII control block and a first 256-bit to-be-encoded block that are input;

determining a control block in the first 256-bit to-be-encoded block according to the MII control block, and compressing the determined control block to obtain a compressed to-be-encoded block;

determining a physical layer encoding format, a value of a sync header, a hierarchy of a block type field, and a value of the block type field according to the MII control block; and obtaining an encoding result by means of mapping the compressed to-be-encoded block to data in a physical layer data format according to the determined physical layer encoding format, adding a sync header to the data and adding, according to the hierarchy of the block type field, a block type field to space obtained by compression, where a value of the added sync header is the determined value of the sync header, and a value of the added block type field is the determined value of the block type field.

With reference to the first aspect, in a first possible implementation manner, the first 256-bit to-be-encoded block includes four 64-bit to-be-encoded blocks, the MII control block includes four 8-bit MII control blocks, and the four 8-bit MII control blocks are in a one-to-one correspondence to the four 64-bit to-be-encoded blocks; and the determining a control block in the first 256-bit to-be-encoded block according to the MII control block, and compressing the determined control block includes:

performing the following steps on each to-be-encoded block in the four 64-bit to-be-encoded blocks:

determining a control block in a 64-bit to-be-encoded block according to a corresponding 8-bit MII control block;

if the 64-bit to-be-encoded block includes eight 8-bit control blocks, compressing each 8-bit control block into a 7-bit control block; and/or if the 64-bit to-be-encoded block includes a terminate codeword, a sequence codeword, or an sfd codeword, compressing the 64-bit to-be-encoded block into a 56-bit block.

With reference to the first aspect or the first possible implementation manner of the first aspect, in a second possible implementation manner, the determining a value of a sync header according to the MII control block includes:

after it is determined, according to the MII control block, that the first 256-bit to-be-encoded block includes a control block, determining the value of the sync header to be a first value; and the method further includes: if it is determined, according to the MII control block, that the first 256-bit to-be-encoded block does not include a control block, determining the value of the sync header to be a second value, where the second value is different from the first value.

With reference to the first aspect or the first or the second possible implementation manner of the first aspect, in a third possible implementation manner, the determining a hierarchy of a block type field and a value of the block type field according to the MII control block includes:

if it is determined, according to the MII control block, that the first 256-bit to-be-encoded block includes N 64-bit control blocks, determining to use a block type field of one level, where N is a positive integer less than 3; and determining a value of a first-level block type field in the block type field of one level, where the value of the first-level block type field is different from a received value of a first-level block type field corresponding to a second 256-bit to-be-encoded block, the second 256-bit to-be-encoded block includes Y 64-bit control blocks, where Y is a positive integer less than 3, and the Y 64-bit control blocks are different from the N 64-bit control blocks in type or location, or control blocks of a same type are different in location.

With reference to the third possible implementation manner of the first aspect, in a fourth possible implementation manner, the if it is determined, according to the MII control block, that the first 256-bit to-be-encoded block includes N 64-bit control blocks, determining to use a block type field of one level includes:

if the first 256-bit to-be-encoded block includes one terminate-type 64-bit control block Terminate block and three 64-bit data blocks, determining the value of the first-level block type field in the block type field of one level according to a location of a Terminate codeword in the Terminate block.

With reference to the first aspect or the first or the second possible implementation manner of the first aspect, in a fifth possible implementation manner, the determining a hierarchy of a block type field and a value of the block type field according to the MII control block includes:

if it is determined, according to the MII control block, that the first 256-bit to-be-encoded block includes M 64-bit control blocks, determining to use block type fields of two levels, where M is a positive integer greater than 2 and less than 5;

determining a value of a first-level block type field in the block type fields of two levels, where the value of the first-level block type field is the same as a received value of a first-level block type field corresponding to a third 256-bit to-be-encoded block, and is different from a received value of a first-level block type field corresponding to a fourth 256-bit to-be-encoded block, the third 256-bit to-be-encoded block includes X 64-bit control blocks, where X is a positive integer greater than 2 and less than 5, and the fourth 256-bit to-be-encoded block includes Z 64-bit control blocks, where Z is a positive integer less than 3; and determining a value of a second-level block type field in the block type fields of two levels, where the value of the second-level block type field is different from a received value of a second-level block type field corresponding to a fifth 256-bit to-be-encoded block, the fifth 256-bit to-be-encoded block includes Q 64-bit control blocks, where Q is a positive integer greater than 2 and less than 5, the Q 64-bit control blocks are different from the M 64-bit control blocks in type or location, or control blocks of a same type are different in location, and a value of a first-level block type field corresponding to the fifth 256-bit to-be-encoded block is the same as a value of a first-level block type field corresponding to the first 256-bit to-be-encoded block.

With reference to the third, the fourth, or the fifth possible implementation manner of the first aspect, in a sixth possible implementation manner, the method further includes:

if it is determined, according to the MII control block, that the first 256-bit to-be-encoded block includes at least two 64-bit control blocks, and one of the at least two control blocks is a Terminate block, determining a value of an indication field according to a location of a Terminate codeword in the Terminate block, and adding an indication field to space obtained by compression, where a value of the added indication field is the determined value of the indication field, and the value of the added indication field is used to identify the location of the Terminate codeword in the Terminate block.

With reference to the first aspect, and one of the second to the fifth possible implementation manners of the first aspect, in a seventh possible implementation manner, a width of the sync header is N bits, and N≥1.

According to a second aspect, an encoder is provided, including:

a precoding module, configured to receive a media independent interface MII control block and a first 256-bit to-be-encoded block that are input, and determine a control block in the first 256-bit to-be-encoded block according to the MII control block, and compress the determined control block to obtain a compressed to-be-encoded block; and an encoding module, configured to determine a physical layer encoding format, a value of a sync header, a hierarchy of a block type field, and a value of the block type field according to the MII control block; and obtain an encoding result by means of mapping the compressed to-be-encoded block, output by the precoding module, to data in a physical layer data format according to the determined physical layer encoding format, adding a sync header to the data, and adding, according to the hierarchy of the block type field, a block type field to space that is obtained by compression by the precoding module, where a value of the added sync header is the determined value of the sync header, and a value of the added block type field is the determined value of the block type field.

With reference to the second aspect, in a first possible implementation manner, the first 256-bit to-be-encoded block includes four 64-bit to-be-encoded blocks, the MII control block includes four 8-bit MII control blocks, and the four 8-bit MII control blocks are in a one-to-one correspondence to the four 64-bit to-be-encoded blocks; and the precoding module includes four precoding units, and each precoding unit performs the following steps on each to-be-encoded block in the four 64-bit to-be-encoded blocks:

determining a control block in a 64-bit to-be-encoded block according to a corresponding 8-bit MII control block; if the 64-bit to-be-encoded block includes eight 8-bit control blocks, compressing each 8-bit control block into a 7-bit control block; and/or if the 64-bit to-be-encoded block includes a terminate codeword, a sequence codeword, or an sfd codeword, compressing the 64-bit to-be-encoded block into a 56-bit block.

With reference to the second aspect, in a second possible implementation manner, the encoding module is specifically configured to: if it is determined, according to the MII control block, that the first 256-bit to-be-encoded block includes a control block, determine the value of the sync header to be a first value; and if it is determined, according to the MII control block, that the first 256-bit to-be-encoded block does not include a control block, determine the value of the sync header to be a second value, where the second value is different from the first value.

With reference to the second aspect, in a third possible implementation manner, the encoding module is specifically configured to: if it is determined, according to the MII control block, that the first 256-bit to-be-encoded block includes N 64-bit control blocks, determine to use a block type field of one level, where N is a positive integer less than 3; and determine a value of a first-level block type field in the block type field of one level, where the value of the first-level block type field is different from a received value of a first-level block type field corresponding to a second 256-bit to-be-encoded block, the second 256-bit to-be-encoded block includes Y 64-bit control blocks, where Y is a positive integer less than 3, and the Y 64-bit control blocks are different from the N 64-bit control blocks in type or location, or control blocks of a same type are different in location.

With reference to the second aspect, in a fourth possible implementation manner, the encoding module is specifically configured to: if the first 256-bit to-be-encoded block includes one terminate-type 64-bit control block Terminate block and three 64-bit data blocks, determine the value of the first-level block type field in the block type field of one level according to a location of a Terminate codeword in the Terminate block.

With reference to the second aspect or the first possible implementation manner of the second aspect, in a fifth possible implementation manner, the encoding module is specifically configured to: if it is determined, according to the MII control block, that the first 256-bit to-be-encoded block includes M 64-bit control blocks, determine to use block type fields of two levels, where M is a positive integer greater than 2 and less than 5; determine a value of a first-level block type field in the block type fields of two levels, where the value of the first-level block type field is the same as a received value of a first-level block type field corresponding to a third 256-bit to-be-encoded block, and is different from a received value of a first-level block type field corresponding to a fourth 256-bit to-be-encoded block, the third 256-bit to-be-encoded block includes X 64-bit control blocks, where X is a positive integer greater than 2 and less than 5, and the fourth 256-bit to-be-encoded block includes Z 64-bit control blocks, where Z is a positive integer less than 3; and determine a value of a second-level block type field in the block type fields of two levels, where the value of the second-level block type field is different from a received value of a second-level block type field corresponding to a fifth 256-bit to-be-encoded block, the fifth 256-bit to-be-encoded block includes Q 64-bit control blocks, where Q is a positive integer greater than 2 and less than 5, the Q 64-bit control blocks are different from the M 64-bit control blocks in type or location, or control blocks of a same type are different in location, and a value of a first-level block type field corresponding to the fifth 256-bit to-be-encoded block is the same as a value of a first-level block type field corresponding to the first 256-bit to-be-encoded block.

With reference to one of the third to the fifth possible implementation manners of the second aspect, in a sixth possible implementation manner, the encoding module is further configured to: if it is determined, according to the MII control block, that the first 256-bit to-be-encoded block includes at least two 64-bit control blocks, and one of the at least two control blocks is a Terminate block, determine a value of an indication field according to a location of a Terminate codeword in the Terminate block, and add an indication field to space that is obtained by compression by the precoding module, where a value of the added indication field is the determined value of the indication field, and the value of the added indication field is used to identify the location of the Terminate codeword in the Terminate block.

With reference to the second aspect, and one of the first to the fifth possible implementation manners of the second aspect, in a seventh possible implementation manner, a width of the sync header is N bits, and N≥1.

According to a third aspect, a decoding method is provided, including:

receiving a first to-be-decoded block;

determining a physical layer data format of the first to-be-decoded block according to a value of a sync header, a hierarchy of a block type field, and a value of the block type field of the first to-be-decoded block;

acquiring, according to the physical layer data format of the first to-be-decoded block, a control block and a data block that are in the first to-be-decoded block, and generating a media independent interface MII control block;

decompressing the acquired control block; and outputting a decompressed control block and the acquired data block as a 256-bit block, and outputting the MII control block.

With reference to the third aspect, in a first possible implementation manner, the determining a physical layer data format of the first to-be-decoded block according to a value of a sync header, a hierarchy of a block type field, and a value of the block type field of the first to-be-decoded block includes:

if the value of the sync header of the first to-be-decoded block is a first value, determining that the first to-be-decoded block includes a control block; and the method further includes:

receiving a third to-be-decoded block; and determining a physical layer data format of the third to-be-decoded block according to a value of a sync header, a hierarchy of a block type field, and a value of the block type field of the third to-be-decoded block, and acquiring a data block in the third to-be-decoded block according to the physical layer data format of the third to-be-decoded block, where the determining a physical layer data format of the third to-be-decoded block according to a value of a sync header, a hierarchy of a block type field, and a value of the block type field of the third to-be-decoded block includes:

if the value of the sync header of the third to-be-decoded block is a second value, determining that the third to-be-decoded block does not include a control block, where the second value is different from the first value.

With reference to the third aspect, in a second possible implementation manner, the determining a physical layer data format of the first to-be-decoded block according to a value of a sync header, a hierarchy of a block type field, and a value of the block type field of the first to-be-decoded block includes:

if it is determined, according to the value of the sync header of the first to-be-decoded block, that the first to-be-decoded block includes a control block, determining the hierarchy of the block type field of the first to-be-decoded block according to a value of a block type field of one level of the first to-be-decoded block;

if it is determined that the hierarchy of the block type field of the first to-be-decoded block is one level, determining that the first to-be-decoded block includes N 64-bit control blocks, where N is a positive integer less than 3; and if it is determined that the hierarchy of the block type field of the first to-be-decoded block is at least two levels, determining that the first to-be-decoded block includes M 64-bit control blocks, where M is a positive integer greater than 2 and less than 5.

With reference to the second possible implementation manner of the third aspect, in a third possible implementation manner, the determining a physical layer data format of the first to-be-decoded block according to a value of a sync header, a hierarchy of a block type field, and a value of the block type field of the first to-be-decoded block further includes:

if it is determined that the hierarchy of the block type field of the first to-be-decoded block is one level, and it is determined, according to the determined value of the block type field of one level, that a Terminate block exists in a 64-bit control block in the first to-be-decoded block, determining a location of a Terminate codeword in the Terminate block according to the determined value of the block type field of one level.

With reference to the third aspect, in a fourth possible implementation manner, if it is determined, according to the determined physical layer data format of the first to-be-decoded block, that the first to-be-decoded block further includes an indication field, the method further includes:

determining a location of a Terminate codeword in a Terminate block control block of the first to-be-decoded block according to a value of the indication field.

With reference to the third aspect, in a fifth possible implementation manner, the decompressing the control block in the first to-be-decoded block includes:

dividing the first to-be-decoded block into four second to-be-decoded blocks, and separately performing the following steps on the four second to-be-decoded blocks: if the second to-be-decoded block includes eight 7-bit control blocks, decompressing each 7-bit control block to an 8-bit control block; and if the second to-be-decoded block includes a Terminate codeword, a sequence codeword, or an sfd codeword, decompressing the second to-be-decoded block to a 64-bit block.

With reference to the third aspect, and one of the first to the fifth possible implementation manners of the third aspect, in a sixth possible implementation manner, a width of the sync header is N bits, and N≥1.

According to a fourth aspect, a decoder is provided, including:

a decoding module, configured to receive a first to-be-decoded block; determine a physical layer data format of the first to-be-decoded block according to a value of a sync header, a hierarchy of a block type field, and a value of the block type field of the first to-be-decoded block; and acquire, according to the physical layer data format of the first to-be-decoded block, a control block and a data block that are in the first to-be-decoded block, and generate a media independent interface MII control block; and a decompressing module, configured to decompress the control block acquired by the decoding module; and output a decompressed control block and the data block acquired by the decoding module, as a 256-bit block, and output the MII control block generated by the decoding module.

With reference to the fourth aspect, in a first possible implementation manner, the decoding module is specifically configured to: if the value of the sync header of the first to-be-decoded block is a first value, determine that the to-be-decoded block includes a control block; and the decoding module is further configured to receive a third to-be-decoded block; determine a physical layer data format of the third to-be-decoded block according to a value of a sync header, a hierarchy of a block type field, and a value of the block type field of the third to-be-decoded block, and acquire a data block in the third to-be-decoded block according to the physical layer data format of the third to-be-decoded block; and if the value of the sync header of the third to-be-decoded block is a second value, determine that the third to-be-decoded block does not include a control block, where the second value is different from the first value.

With reference to the fourth aspect, in a second possible implementation manner, the decoding module is specifically configured to: if it is determined, according to the value of the sync header of the first to-be-decoded block, that the first to-be-decoded block includes a control block, determine the hierarchy of the block type field of the first to-be-decoded block according to a value of a block type field of one level of the first to-be-decoded block; if it is determined that the hierarchy of the block type field of the first to-be-decoded block is one level, determine that the first to-be-decoded block includes N 64-bit control blocks, where N is a positive integer less than 3; and if it is determined that the hierarchy of the block type field of the first to-be-decoded block is at least two levels, determine that the first to-be-decoded block includes M 64-bit control blocks, where M is a positive integer greater than 2 and less than 5.

With reference to the second possible implementation manner of the fourth aspect, in a third possible implementation manner, the decoding module is further specifically configured to: if it is determined that the hierarchy of the block type field of the first to-be-decoded block is one level, and it is determined, according to the determined value of the block type field of one level, that a Terminate block exists in a 64-bit control block in the first to-be-decoded block, determine a location of a terminate codeword in the Terminate block according to the determined value of the block type field of one level.

With reference to the fourth aspect, in a fourth possible implementation manner, the decoding module is specifically configured to: if it is determined, according to the determined physical layer data format of the first to-be-decoded block, that the first to-be-decoded block further includes an indication field, determine a location of a Terminate codeword in a Terminate block control block of the first to-be-decoded block according to a value of the indication field.

With reference to the fourth aspect, in a fifth possible implementation manner, the decompressing module includes four decompressing units, the decompressing module divides the first to-be-decoded block into four second to-be-decoded blocks, and each decompressing unit separately performs the following steps on the four second to-be-decoded blocks:

if the second to-be-decoded block includes eight 7-bit control blocks, decompressing each 7-bit control block to an 8-bit control block; and if the second to-be-decoded block includes a Terminate codeword, a sequence codeword, or an sfd codeword, decompressing the second to-be-decoded block to a 64-bit block.

According to a fifth aspect, an apparatus is provided, where the apparatus may be one of the following apparatuses:

a PHY, where the PHY may be implemented by using an FPGA or an ASIC, the PHY may be a component in a network interface card (Network Interface Card, NIC), the NIC may be a line card (Line Card) or a PIC (Physical Interface Card, physical interface card), and the PHY may include a Media-Independent Interface (media independent interface, MII) for interfacing to (for interfacing to) MAC;

a PHY chip (PHY chip), where the PHY chip may include multiple PHYs, and the PHY chip may be implemented by using an FPGA or an ASIC;

a system chip (system chip), where the system chip may include multiple MACs and multiple PHYs, and the system chip may be implemented by using an FPGA or an ASIC; and a multi-port Ethernet device (multi-port Ethernet device), where the multi-port Ethernet device may be an Ethernet hub, an Ethernet router, or an Ethernet switch, the multi-port Ethernet device includes multiple ports, each port may include a system chip, the system chip may include a MAC and a PHY, the multi-port Ethernet device may further integrate multiple MACs into one MAC chip (MAC chip) and integrate multiple PHYs into one PHY chip, and the multi-port Ethernet device may also integrate multiple MACs and multiple PHYs into one system chip; and the apparatus can perform the method provided in the first aspect or any one of the possible implementation manners of the first aspect.

According to a sixth aspect, an apparatus is provided, where the apparatus may be one of the following apparatuses:

a PHY, where the PHY may be implemented by using an FPGA or an ASIC, the PHY may be a component in a network interface card (Network Interface Card, NIC), the NIC may be a line card (Line Card) or a PIC (Physical Interface Card, physical interface card), and the PHY may include a Media-Independent Interface (media independent interface, MII) for interfacing to (for interfacing to) MAC;

a PHY chip (PHY chip), where the PHY chip may include multiple PHYs, and the PHY chip may be implemented by using an FPGA or an ASIC;

a system chip (system chip), where the system chip may include multiple MACs and multiple PHYs, and the system chip may be implemented by using an FPGA or an ASIC; and a multi-port Ethernet device (multi-port Ethernet device), where the multi-port Ethernet device may be an Ethernet hub, an Ethernet router, or an Ethernet switch, the multi-port Ethernet device includes multiple ports, each port may include a system chip, the system chip may include a MAC and a PHY, the multi-port Ethernet device may further integrate multiple MACs into one MAC chip (MAC chip) and integrate multiple PHYs into one PHY chip, and the multi-port Ethernet device may also integrate multiple MACs and multiple PHYs into one system chip; and the apparatus can perform the method provided in the third aspect or any one of the possible implementation manners of the third aspect.

In the foregoing embodiments of the present invention, during encoding, a physical layer encoding format, a value of a sync header, a hierarchy of a block type field, and a value of the block type field are determined according to an MII control block; and a precoded to-be-encoded block is mapped to a physical layer data format according to the determined physical layer encoding format, so as to encode a 256-bit block. It can be seen that, in the embodiments of the present invention, by using compressible space of a 256-bit block, it is ensured that a Hamming distance between 256-bit to-be-encoded blocks is not less than 4, and sufficient checksum space can be provided for an RS-FEC algorithm.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and persons of ordinary skill in the art may still derive other drawings from these accompanying drawings without creative efforts.

FIG. 1 is a codeword conversion format table of 64B/66B encoding provided in the existing 802.3ba standard;

FIG. 2A and FIG. 2B are a schematic diagram of the existing 64B/66B encoding plus 256B/257B transcoding scheme;

FIG. 3 is a schematic diagram of an encoding principle according to an embodiment of the present invention;

FIG. 4 is a 256B/257B encoding format table according to an embodiment of the present invention;

FIG. 5 is a 256B/258B encoding format table according to an embodiment of the present invention;

DESCRIPTION OF EMBODIMENTS

To make the objectives, technical solutions, and advantages of the present invention clearer, the following further describes the present invention in detail with reference to the accompanying drawings. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 2B:
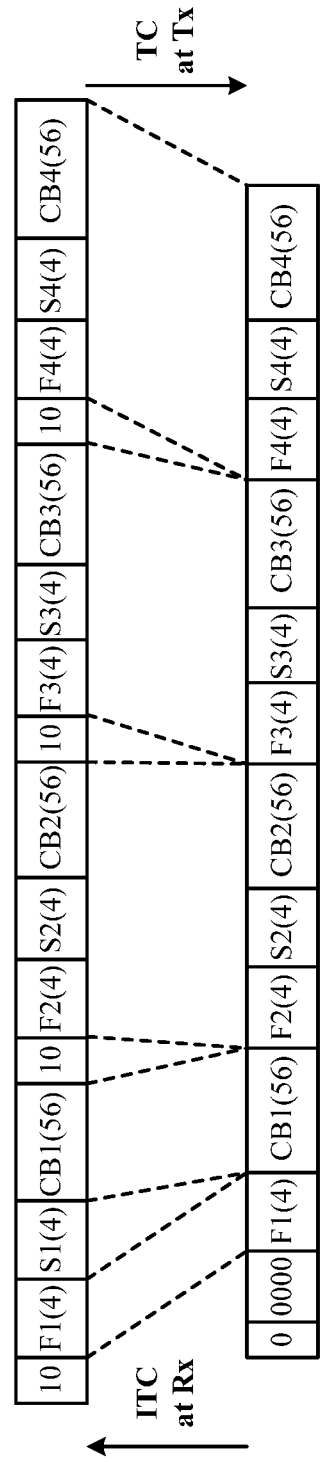

Because 64B/66B no longer adapts to a requirement of FEC (Forward Error Correction, forward error correction) with a high gain in the future, currently, there is an extended evolved scheme, namely, a 64B/66B encoding plus 256B/257B transcoding scheme. In this scheme, for a 256-bit all-data pattern, a transcoding scheme of the 256-bit all-data pattern is shown in FIG. 2A, where DB indicates a 64-bit Data Block (data block), and "01" is sync header indication information and indicates that a following 64-bit Block is a data block. An all-data 256B/257B transcoding scheme shown in FIG. 2A is as follows: The first two bits of sync header indication information "01" in four 66-bit blocks are compressed, and then one bit "1" is used to represent one 257-bit all-data block. For a 256-bit non-all-data pattern, a transcoding scheme of the 256-bit non-all-data pattern is shown in FIG. 2B, where CB indicates a 56-bit Control Block (control block), and "10" is sync header indication information and indicates that a following 56-bit Block is a control block. In the non-all-data 256B/257B transcoding scheme shown in FIG. 2B, the first two bits of sync header indication information of four 66-bit blocks are also compressed during transcoding, one bit "0" is used to represent one 257-bit non-all-data block (control blocks), the first four bits in 8-bit space of a Block Type Field of the first 64-bit control block are reserved, and the last four bits are used as bits for indicating whether four 64-bit blocks are data blocks or control blocks, for example, four 64-bit blocks in FIG. 2B are all control blocks, and therefore, are coded as "0000".

The foregoing 64B/66B encoding plus 256B/257B transcoding scheme is only a type of format conversion, but not an actual direct encoding and decoding scheme, and, at the same time, require 64B/66B encoding and decoding to implement a corresponding function; therefore, the transcoding scheme increases an extra delay, and increases extra occupied resources and power consumption.

For a requirement of using an RS-FEC scheme with a higher gain, this embodiment of the present invention provides a direct encoding and decoding scheme applied to a PCS of a physical layer, where the encoding and decoding scheme may include a 256B/257B encoding and decoding scheme or a 256B/258B encoding and decoding scheme. The following describes in detail the encoding and decoding scheme provided in this embodiment of the present invention.

The 256B/257B encoding in this embodiment of the present invention refers to that: an encoder of the PCS performs codeword encoding mapping on four 64-bit to-be-encoded blocks that are transmitted by using an MII (Media Independence Interface, media independent interface), so as to generate a block payload (Block Payload), a sync header (sync header), and a block type field (Block Type Field); and uses the three to generate a 257-bit block (Block) according to a format and outputs the block. The 256B/257B decoding refers to that: codeword decoding mapping is performed on an input 257-bit block that includes a block payload (Block Payload), a sync header (sync header), and a block type field (Block Type Field), so as to obtain 4*64-bit blocks (MII_TXD), and output the blocks by using the MII. According to the number of 56-bit control blocks included in a 257-bit block on which 256B/257B encoding is performed, an encoded 257-bit block may include a block type field (Block Type Field) of one level or may include block type fields (Block Type Field) of multiple levels, which is used to ensure that a Hamming distance between 256-bit blocks is not less than 4. A process of 256B/258B encoding/decoding is similar to this.

There is a contradiction between encoding efficiency and a size of Block Type space, and is reflected as follows in this embodiment: The Block Type space limits the number of codewords. For example, by means of calculation, a Block Type with a minimum 4-bit Hamming distance is searched for in 8-bit space (that is, a group of codewords that can ensure that a Hamming distance is not less than 4 are searched for), and many groups of codewords may be found, but each group includes 16 codewords at most. Table 1 lists a group that includes 16 codewords.

TABLE 1

Combinations, ensuring that a Hamming distance is not less than 4, in 8-bit space

| 8'h1E | 8'hE1 | 8'h4B | 8'hB4 |
| 8'h78 | 8'h87 | 8'hD2 | 8'h2D |

TABLE 1-continued

Combinations, ensuring that a Hamming distance is not less than 4, in 8-bit space

| 8'h00 | 8'h33 | 8'h55 | 8'h66 |
| 8'h99 | 8'hAA | 8'hCC | 8'hFF |

When 256-bit encoding is used, there are more than 16 combination situations for all codewords; therefore, 8-bit Block Type space cannot ensure a Hamming distance between all 256-bit blocks.

To resolve a current contradiction between encoding and decoding efficiency and Block Type codeword space, in the encoding and decoding scheme provided in this embodiment of the present invention, compression technologies of different codeword space are performed according to compressible space of each 256-bit block to implement compression for different space based on a level and based on a block, so as to achieve a flexible encoding scheme, and ensure that a Hamming distance between 256-bit encoded blocks is not less than 4 in an encoding process.

During specific implementation, for example, on one hand, space (namely, a sync header) in an encoded 256-bit block is used to distinguish a 256-bit all-data block (data blocks) from a 256-bit non-all-data block (control blocks); on the other hand, in the encoded 256-bit block, a Block Type Field (the Block Type Field is referred to as a first-level Block Type Field) is used as Block Type space to ensure a Hamming distance from another 256-bit block. Because of a function of limiting the number of codewords by the Block Type space, it is impossible to use different Block Type Fields to uniquely identify all encoding formats. Therefore, for a 256-bit block from which more space can be obtained by compression, for example, for a 256-bit block that includes two or more 64-bit control blocks, a same first-level Block Type Field value may be used to ensure a Hamming distance from another 256-bit block corresponding to a different Block Type Field value. Among 256-bit blocks that have a same first-level Block Type Field value, an extra Block Type Field (the Block Type Field is referred to as a second-level Block Type Field) is further used as Block Type space, so as to ensure a Hamming distance between the 256-bit blocks that have the same first-level Block Type Field value. If necessary, space obtained by compression may be further used as a third-level Block Type Field or even a higher-level Block Type Field, so as to ensure a Hamming distance between 256-bit blocks. The space obtained by compression may also be used as reserved space.

Optionally, further, for some relatively particular blocks, such as a 64-bit T block (Terminate block, terminate block), a Block Type Field or an extra indication field may be used to distinguish codewords (for example, a 7-bit control codeword and/or an 8-bit data codeword) in a block. Using a 64-bit T block as an example, the T block includes one 8-bit Terminate codeword, and a location of the Terminate codeword in the T block needs to be indicated during encoding. To resolve this problem, the following method is used in this embodiment of the present invention:

(1) If a 256-bit block includes only one 64-bit T block, and the rest are 64-bit data blocks, a first-level Block Type Field value may be used to identify a location of a Terminate codeword in the 64-bit T block. Specifically, when an encoding format table is designed, for a 256-bit block that includes one 64-bit T block and three 64-bit data blocks, different first-level Block Type Field values are set according to different locations, of a Terminate codeword, in the T block, so that on one hand, the Block Type Field value is used to ensure a Hamming distance from another 256-bit block, and on the other hand, the Block Type Field value is used to identify a location of the Terminate codeword in the T block.

(2) If the 256-bit block includes one 64-bit T block and one or more other 64-bit control blocks, space obtained by compression by using these control blocks may be used as an extra indication field to indicate a location of a Terminate codeword in the 64-bit T block.

Based on the foregoing encoding principle, as shown in FIG. 3, in the encoding format table, syna and synb are two values of a sync header, and are used to distinguish all-data blocks (data blocks) from non-all-data blocks (control blocks), where syna is used to identify all-data blocks (data blocks) and synb is used to identify non-all-data blocks (control blocks). The sync header may be of one or more bits. The number of bits of the sync header may be set and adjusted according to a specific architecture, algorithm, and performance requirement, which is not limited in this embodiment of the present invention.

In FIG. 3, type0 to typea are values of a first-level Block Type Field, and typeA to typeD are values of a second-level Block Type Field. Because of a function of limiting the number of codewords by the Block Type space, different Block Type Field values cannot be used to uniquely identify one encoding format. Therefore, for a 256-bit block that includes three or four 64-bit control blocks (Control block), a same first-level Block Type Field value (for example, typea shown in the figure) is used, then space obtained by compression inside the 256-bit block is used as a second-level Block Type Field, and different values (for example, typeA, typeB, typeC, and typeD in the figure) of the second-level Block Type Field are used to distinguish these 256-bit blocks that have a same first-level Block Type Field. Codeword space (that is, the number of bits in the first-level Block Type Field) of type0 to typea or codeword space (that is, the number of bits in the second-level Block Type Field) of typeA to typeD is preferably 8 bits. Certainly, the number of bits may also be set according to a specific situation, for example, may be less than or greater than 8 bits.

In FIG. 3, a control block filled with slashes indicates a particular block, for example, a T block, and an extra indication field (typeT in the figure) is required to indicate a location of an 8-bit Terminate codeword in the T block. A value of typeT corresponding to a different location of the Terminate codeword is different. For example, if typeT=0x00, it indicates that the Terminate codeword is located in the first byte of the T block (one 64-bit T block is divided into 8 byte groups according to 8 bits being one group); and if typeT=0x11, it indicates that the Terminate codeword is located in the last byte of the T block. The number of bits in the indication field is preferably 8 bits, and certainly, the number of bits in the indication field may also be set according to an actual requirement.

Space of all encoding types (including the first-level Block Type Field, the second-level Block Type Field, and the indication field) is obtained by compression from a 64-bit control block, such as an S block (start block, start block), a T block, or a C block (Control block, control block). In addition to that a bit obtained by compression from a control block is used for the foregoing first-level Block Type Field, the second-level Block Type Field, and the indication field, if there is a remaining bit, the remaining bit may be used as a reserved bit field (for example, a Res field shown in FIG. 3). Further, according to a requirement, the Res field may also be used as a third-level or fourth-level Block Type Field.

In FIG. 3, the values (for example, type0 to typea in the figure) of the first-level Block Type Field and the values (for example, typeA to typeD in the figure) of the second-level Block Type Field are merely exemplary, and in an actual application, values shown in Table 1 may be selected.

It should be noted that the encoding format shown in FIG. 3 is only an example, and an encoding format table obtained according to the foregoing encoding principle should fall within the protection scope of the present invention.

Based on the foregoing encoding principle, FIG. 4 shows a 256B/257B encoding format table provided in this embodiment of the present invention. The number of bits in a sync header is one bit, the number of bits in a Block Type Field field is 8 bits, and the number of bits in an indication field is 8 bits.

As shown in FIG. 4, when a value of the sync header is "0", it indicates that 256-bit blocks are all-data blocks (data blocks); and when the value is "1", it indicates that the 256-bit blocks are non-all-data blocks (control blocks).

For a 256-bit block that includes one 64-bit T block and three 64-bit DATA blocks (data block), a different first-level Block Type Field value (type0 to type7) is used for distinguishing, and the first-level Block Type Field value may also identify a location of an 8-bit Terminate codeword in the T block. As shown in FIG. 4, when a value of the first-level Block Type Field is type0, it indicates that the Terminate codeword is located in the first byte of the T block; when the value of the first-level Block Type Field is type1, it indicates that the Terminate codeword is located in the second byte, and so on.

For a 256-bit block that includes one 64-bit T block and two or more other 64-bit control blocks (for example, S blocks and C blocks), a same first-level Block Type Field value (typed) is used and is different from the foregoing type0 to type7 values. In these 256-bit blocks, space obtained by compression by using control blocks is used to set a second-level Block Type Field field, and a different value (for example, typeA to typeE in the figure) of the second-level Block Type Field is used for distinguishing. Similarly, for a 256-bit block that includes four 64-bit C blocks or includes four 64-bit O blocks, a value of a first-level Block Type Field may be set to typed, then inside the 256-bit block, space obtained by compression by using the control blocks is used to set a second-level Block Type Field, and a different value (for example, typeF and typeG in the figure) of the second-level Block Type Field is used for distinguishing.

In addition, for a 256-bit block that includes one 64-bit T block and one or more other 64-bit control blocks (for example, S blocks and C blocks), an indication field is set in the 256-bit block according to a location of an 8-bit Terminate codeword in the T block, and a different value (for example, typeT in the figure) of the indication field is used to identify the location of the Terminate codeword.

In FIG. 4, type0 to type7 and typeA to typeE can be selected from Table 1, so as to ensure that a Hamming distance is not less than 4.

In FIG. 4, to simplify the number of states of an Order sequence, it is ensured that the Order sequence is aligned according to 256 bits, which does not affect implementability (for example, a problem of inserting an AM (Alignment Marker, alignment marker)) of the entire design. Certainly, a manner of simplifying a design is not limited to the foregoing manner.

It can be seen from the 256B/257B encoding format table shown in FIG. 4 that, a Hamming distance between 13 types of 256-bit blocks corresponding to the values (type0 to type9, and typea to typec) of the first-level Block Type Field may be ensured to be not less than 4; that a Hamming distance between seven types of 256-bit blocks corresponding to the value typed of the first-level Block Type Field and the foregoing 13 types of 256-bit blocks may be ensured to be not less than 4; a Hamming distance between the seven types of 256-bit blocks corresponding to the value typed of the first-level Block Type Field may be at least 4 bits by using a different value (typeA to typeG) of the second-level Block Type Field; and by using the indication field, a Hamming distance between different Terminate locations in 64-bit T blocks is ensured to be not less than 4. In this way, it can be ensured that a Hamming distance between 256-bit blocks is not less than 4 in this embodiment of the present invention.

For values of Block Type Fields and values of the indication field in FIG. 4, reference may be made to Table 1. Table 2 shows a table of values of Block Type Fields and an indication field. Table 2 is only an example and does not constitute any limitation to the present invention.

TABLE 2

Values of Block Type Fields and an indication field

| Type | Value |
|---|---|
| First-level Block Type Field | type0 = 8'h1E type1 = 8'hE1 type2 = 8'h4B type3 = 8'hB4 type4 = 8'h78 type5 = 8'h87 type6 = 8'hD2 type7 = 8'h2D type8 = 8'h33 type9 = 8'h55 typea = 8'h66 typeb = 8'h99 typec = 8'hAA typed = 8'hCC |
| Second-level Block Type Field | typeA = 8'h1E typeB = 8'hE1 typeC = 8'h4B typed = 8'hB4 typeE = 8'h78 typeF = 8'h87 typeG = 8'hD2 |
| Indication field (typeT) | typeT1 = 8'h87 typeT2 = 8'h78 typeT3 = 8'h33 typeT4 = 8'h55 typeT5 = 8'h66 typeT6 = 8'h99 typeT7 = 8'hAA typeT8 = 8'hCC |

Based on the foregoing encoding principle, FIG. 5 shows a 256B/258B encoding format table provided in this embodiment of the present invention. The number of bits in a Block Type Field field and the number of bits in an indication field are both 8 bits, which are the same as those in a Block Type Field field and an indication field in the 256B/257B encoding format table shown in FIG. 4; and the number of bits in a sync header is 2 bits, one bit more than that in a sync header in the 256B/257B encoding format table shown in FIG. 4. The 256B/258B encoding format table shown in FIG. 5 is basically the same as the 256B/257B encoding format table shown in FIG. 4. For values of Block Type Fields and an indication field in FIG. 5, reference may be made to the values in Table 1. Details are not described herein again.

According to the foregoing encoding principle, when an encoding format table is set, values of the Block Type Fields may be set according to the following rules.

For a 256-bit block that includes one or two 64-bit control blocks, a block type field of one level (namely, a first-level Block Type Field) may be used to ensure a Hamming distance between these 256-bit blocks, and a value of the first-level Block Type Field may be determined according to a type or location of an included 64-bit control block. Using that both a first 256-bit block and a second 256-bit block include one or two 64-bit control blocks as an example, in the following several cases, a value of a first-level block type field of the first 256-bit block is different from that of the second 256-bit block:

Case 1: A type of a 64-bit control block in the first 256-bit block is different from a type of a control block in the second 256-bit block. For example, both 257-bit blocks shown in the 11$^{th}$ and 12$^{th}$ rows in FIG. 4 include two 64-bit DATA Blocks and two control blocks, and because types of the control blocks are not all the same (the two control blocks in the 11$^{th}$ row are a T block and an S block, and the two control blocks in the 12$^{th}$ row are a T block and a C block), the values of the first-level Block Type Fields are different, that is, type9 and typea separately.

Case 2: A location of a 64-bit control block in the first 256-bit block is different from a location of a control block in the second 256-bit block. For example, both 257-bit blocks shown in the 11$^{th}$ and 13$^{th}$ rows in FIG. 4 include two 64-bit DATA Blocks, and two control blocks of a same type, but because arrangement locations of the DATA Blocks and the control blocks are different, the values of the first-level Block Type Fields are different, that is, type9 and typeb separately.

Case 3: A type of a 64-bit control block in the first 256-bit block is the same as a type of a control block in the second 256-bit block, but a location of the 64-bit control block in the first 256-bit block is different from a location of the control block in the second 256-bit block. For example, the first 256-bit block sequentially includes two 64-bit DATA Blocks, one S block, and one C block, and the second 256-bit block sequentially includes two 64-bit DATA Blocks, one C block, and one S block; therefore, the value of the first-level Block Type Field of the first 256-bit block is different from that of the second 256-bit block.

For a 256-bit block that includes three or four 64-bit control blocks, block type fields of two levels (that is, a first-level Block Type Field and a second-level Block Type Field) may be used. When a value of the first-level Block Type Field in the block type fields of two levels is determined, a value of a first-level Block Type Field of all 256-bit blocks that include three or four 64-bit control blocks may be set to a same value, but the value is different from a value of a first-level Block Type Field of a 256-bit block that includes one or two 64-bit control blocks. For example, values of first-level Block Type Fields in 257-bit blocks in the 15$^{th}$ to 21$^{st}$ rows in FIG. 4 are the same, but are different from a value of a first-level Block Type Field in any one of 257-bit blocks shown in the 2$^{nd}$ to 14$^{th}$ rows.

When a value of the second-level Block Type Field in the block type fields of two levels is determined, the value of the second-level Block Type Field may be determined according to a type or a location of an included 64-bit control block. Using that both a third 256-bit block and a fourth 256-bit block include three or four 64-bit control blocks as an example, in the following several cases, a value of a second-level block type field of the third 256-bit block is different from that of the fourth 256-bit block:

Case 1: A type of a 64-bit control block in the third 256-bit block is different from a type of a control block in the fourth 256-bit block. For example, both 257-bit blocks shown in the 15$^{th}$ and 16$^{th}$ rows in FIG. 4 include one 64-bit DATA Block and three control blocks, but because types of the control blocks are not all the same, the values of the second-level Block Type Fields are different, that is, typeA and typeB separately.

Case 2: A location of a 64-bit control block in the third 256-bit block is different from a location of a control block in the fourth 256-bit block. For example, both 257-bit blocks shown in the 16$^{th}$ and 17$^{th}$ rows in FIG. 4 include one 64-bit DATA Block and three control blocks, but because arrangement locations of the DATA Block and the control blocks are different, the values of the second-level Block Type Fields are different, that is, typeB and typeC separately.

Case 3: A type of a 64-bit control block in the third 256-bit block is the same as a type of a control block in the fourth 256-bit block, but a location of the 64-bit control block in the third 256-bit block is different from a location of the control block in the fourth 256-bit block. For example, the third 256-bit block sequentially includes one 64-bit DATA Block, two C blocks, and one S block, and the fourth 256-bit block sequentially includes one 64-bit DATA Block, one C block, one S block, and one C Block; therefore, the value of the second-level Block Type Field of the third 256-bit block is different from that of the fourth 256-bit block.

Figure 6:
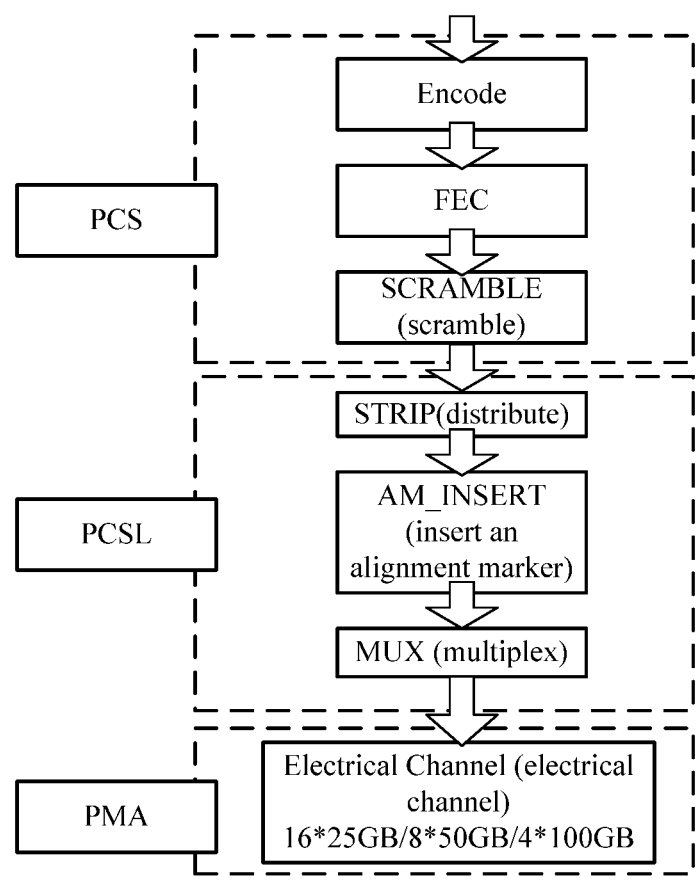
FIG. 6 is a schematic diagram of an application architecture according to an embodiment of the present invention.

The encoding scheme (such as the 256B/257B encoding and decoding scheme and the 256B/258B encoding and decoding scheme) provided in this embodiment of the present invention may be applied to a high-speed Ethernet, such as a next-generation 400G Ethernet. FIG. 6 shows an architecture of a next-generation 400G Ethernet using an encoding and decoding scheme provided in this embodiment of the present invention.

As shown in FIG. 6, after receiving data by using an MII an encoder at a PCS performs encoding according to an encoding mode (for example, 256B/257B encoding or 256B/258B encoding) provided in this embodiment of the present invention, and the encoder outputs encoded data to an FEC module; the FEC module inserts an FEC check sequence and outputs data to a scrambling module; the scrambling module performs scrambling processing on the data and outputs data to a data distribution module; the data distribution module performs distribution processing on the data; and then, an AM is inserted periodically, and FEC-Symbol multiplexing is performed.

Figure 7:
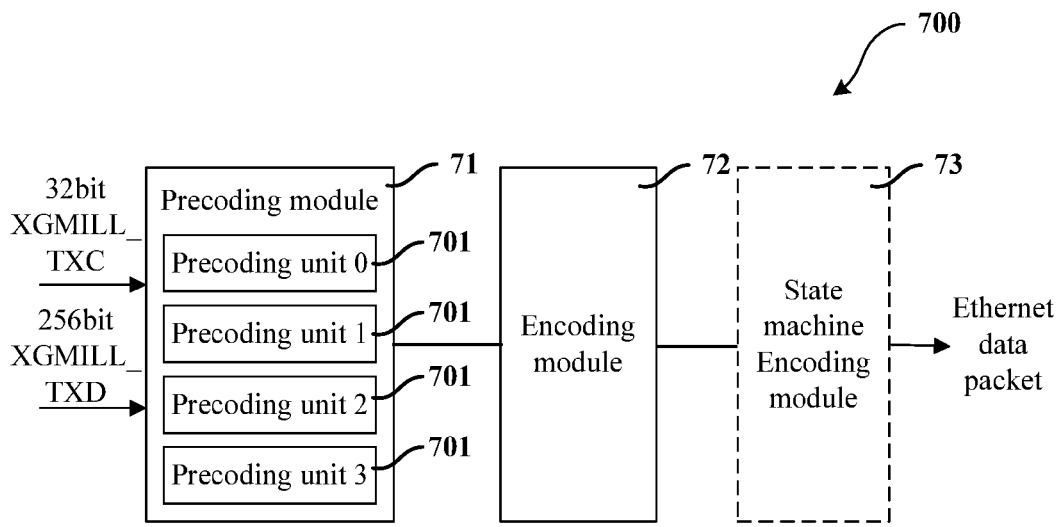
FIG. 7 is a schematic structural diagram of an encoder according to an embodiment of the present invention.
Figure 8:
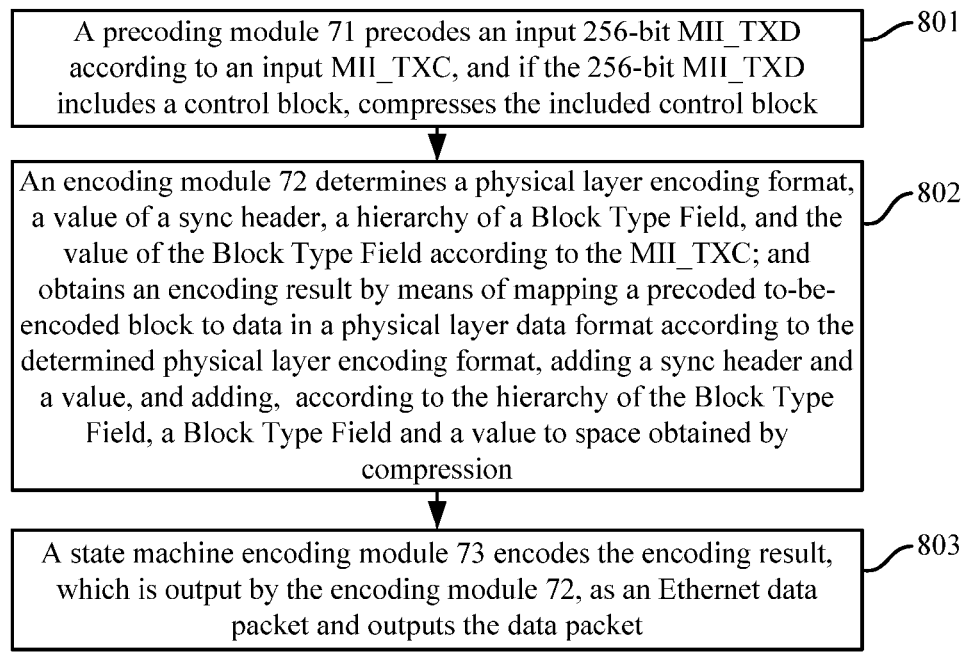
FIG. 8 is a schematic diagram of an encoding process according to an embodiment of the present invention.
Figure 9:
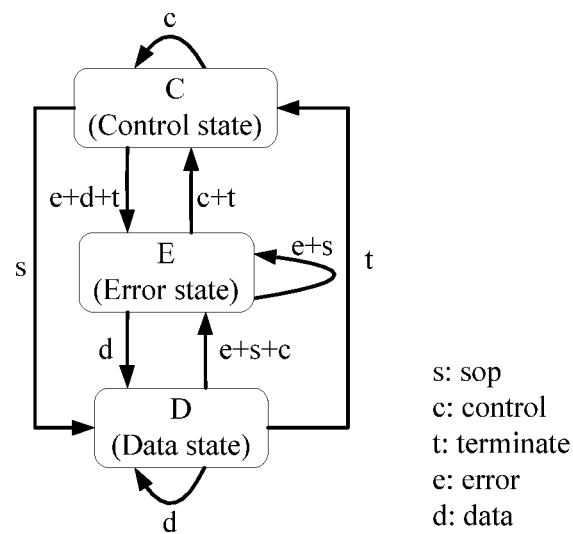
FIG. 9 is a schematic diagram of a general state jump according to an embodiment of the present invention.
Figure 10:
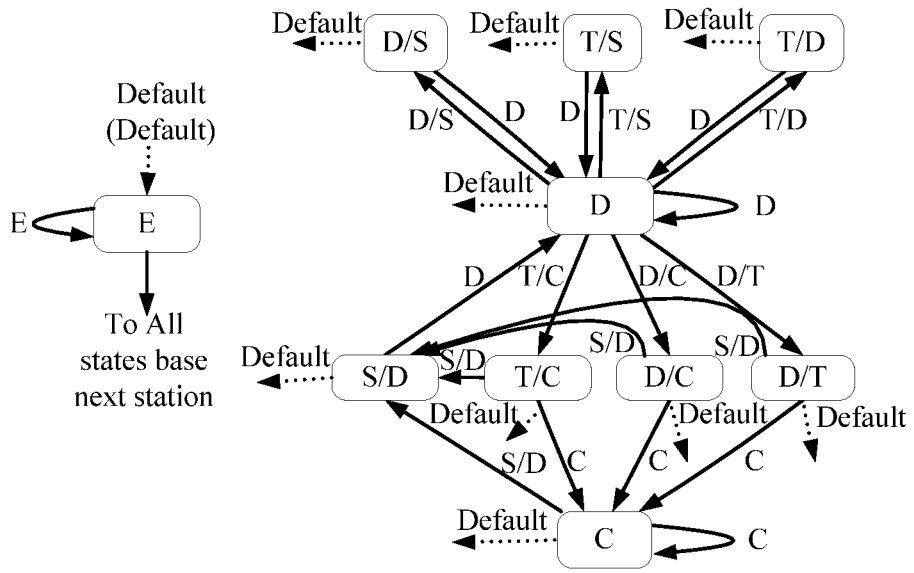
FIG. 10 is a first schematic diagram of a state machine of a 256B/257B encoding scheme according to an embodiment of the present invention.

With reference to FIG. 7 and FIG. 8, the following describes an encoder and an encoding process provided in an embodiment of the present invention; and with reference to FIG. 9 and FIG. 10, the following describes a decoder and a decoding process provided in an embodiment of the present invention.

Referring to FIG. 7, FIG. 7 is a schematic structural diagram of an encoder according to an embodiment of the present invention, where the encoder may be implemented by a logic circuit and is configured to perform a direct encoding function provided in the foregoing embodiment of the present invention.

As shown in FIG. 7, the encoder 700 may include a precoding module 71 and an encoding module 72, and may further include a state machine encoding module 73.

The precoding module 71 may precode an input 256-bit to-be-encoded block (MII_TXD for short in the following) according to an input MII control block (MII_TXC for short in the following), and output a precoded to-be-encoded block and the MII_TXC to the encoding module 72; and if a 256-bit MII_TXD includes a control block, compress the included control block.

The encoding module 72 may determine a physical layer encoding format, a value of a sync header, a hierarchy of a Block Type Field (block type field), and a value of the Block Type Field according to the MII_TXC (the MII_TXC may also be directly input to the encoding module 72) output by the precoding module 71 to the encoding module 72, and an encoding format table (such as FIG. 3, FIG. 4, or FIG. 5) provided in this embodiment of the present invention; map a precoded (that is, decompressed) MII_TXD, which is output by the precoding module 71, to data in a physical layer data format according to the determined physical layer encoding format; add a sync header, where a value of the added sync header is the previously determined value of the sync header; and add, according to the hierarchy of the Block Type Field, a Block Type Field to space that is obtained by compression by the precoding module 71, where a value of the added Block Type Field is the previously determined value of the Block Type Field, and output an encoding result to the state machine encoding module 73.

The state machine encoding module 73 is configured to encode the encoding result, which is output by the encoding module 72, as an Ethernet data packet and output the data packet.

MII_TXCs input to the precoding module 71 from an MII are four 8-bit MII_TXCs, MII_TXDs input to the precoding module 71 from an MII are four 64-bit MII_TXDs, an 8-bit MII_TXC is in a one-to-one correspondence to a 64-bit MII_TXD, and an 8-bit MII_TXC is used to indicate whether each group of 8-bit blocks in a corresponding 64-bit MII_TXD is a data block or a control block. Correspondingly, the precoding module 71 may include four precoding units 701, so as to separately perform precoding processing on the four 8-bit MII_TXCs and the four 64-bit MII_TXDs.

With reference to FIG. 8, the following describes in detail an encoding process of the foregoing encoder 700.

FIG. 8 is a schematic flowchart of an encoding method according to an embodiment of the present invention. As shown in the figure, the method may include:

Step 801: A precoding module 71 in an encoder 700 precodes an input 256-bit MII_TXD according to an input MII_TXC; and if the 256-bit MII_TXD includes a control block, compresses the included control block.

During specific implementation, each precoding unit 701 in the precoding module 71 may perform precoding processing on a corresponding 64-bit MII_TXD according to one 8-bit MII_TXC in four 8-bit MII_TXCs. The precoding processing may include: if the 64-bit MII_ TXD includes an 8-bit control block, compressing the 8-bit control block into a 7-bit control block, that is, one bit can be obtained by compression from every 8 bits, a 64-bit block may be compressed into a 56-bit block plus 8-bit space, and the 8-bit space is mapped or reserved correspondingly in a subsequent encoding block. For a 64-bit all-data block (data blocks), the 64-bit block remains unchanged. During specific implementation, for compression on a control block, reference may be made to Table 3.

TABLE 3

Conversion table between a control codeword within 64 bits and a compressed 56-bit codeword

| Control codeword type | Format of input control information | Format after precoding processing |
|---|---|---|
| error | 8'fe | 7'h1e |
| idle | 8'h00 | 7'h07 |
| terminate | 8'hfd | 8-bit space is completely obtained by compression |
| sequence | 8'h9c | 8-bit space is completely obtained by compression |
| sfd | 8'hfb | 8-bit space is completely obtained by compression |

According to Table 3, for a control block, 8-bit control information is compressed into 7-bit information, and 1-bit space is obtained by compression. If a 64-bit block includes a control codeword such as terminate, sequence, or sfd, 8-bit space can be directly obtained by compression.

Step 802: An encoding module 72 in the encoder 700 determines a physical layer encoding format, a value of a sync header, a hierarchy of a Block Type Field, and a value of a Block Type Field of each level according to the MII_TXC; and obtains an encoding result by means of mapping a precoded to-be-encoded block to data in a physical layer data format according to the determined physical layer encoding format, adding a sync header, and adding, according to the hierarchy of the Block Type Field, a Block Type Field to space that is obtained by compression by the precoding module 71, where a value of the sync header is the determined value of the sync header, and a value of the Block Type Field is the determined value of the Block Type Field.

During specific implementation, when determining the value of the sync header, if it is determined, according to a 32-bit MII_TXC, that a 256-bit MII_TXD includes a control block, the encoding module 72 determines the value of the sync header to be a first value; and if it is determined, according to the 32-bit MII_TXC, that the 256-bit MII_TXD is an all-data block (data blocks), the encoding module 72 determines the value of the sync header to be a second value. For example, corresponding to the foregoing 256B/257B encoding mode, the sync header is 1 bit; when the 256-bit MII_TXD is an all-data block (data blocks), the sync header value is determined to be "0"; otherwise, the sync header value is determined to be "1". Corresponding to the foregoing 256B/258B encoding mode, the sync header is 2 bits; when the 256-bit MII_TXD is an all-data block (data blocks), the sync header value is determined to be "01"; otherwise, the sync header value is determined to be "10".

For example, when determining the hierarchy of the Block Type Field and the value of the Block Type Field, if it is determined, according to the 32-bit MII_TXC, that the 256-bit MII_TXD includes three or more 64-bit control blocks, the encoding module 72 determines to use block type fields of two levels, where values of first-level Block Type Fields of all MII_TXDs that include three or more 64-bit control blocks are the same, and values of second-level Block Type Fields may be set according to types and/or locations of the control blocks and a data block (in a case in which a data block is included). For details, refer to the foregoing descriptions. For another example, when determining the hierarchy of the Block Type Field and the value of the Block Type Field, if it is determined, according to the 32-bit MII_TXC, that the 256-bit MII_TXD includes two or less 64-bit control blocks, the encoding module 72 determines to use a block type field of one level, where a value of the Block Type Field may be set according to types and/or locations of the control blocks and a data block (in a case in which a data block is included). For details, refer to the foregoing descriptions. If the 256-bit MII_TXD includes one 64-bit Terminate block and three 64-bit data blocks, the value of the first-level block type field is determined according to a location of a Terminate codeword in the Terminate block.

Optionally, further, if it is determined, according to the MII_TXC, that the MII_TXC includes at least two 64-bit control blocks, and one of the at least two 64-bit control blocks is a Terminate block, the encoding module 72 determines a value of an indication field according to a location of a Terminate codeword in the Terminate block; and adds an indication field to space that is obtained by compression by the precoding module 71, and adds the determined value of the indication field to the indication field, where the value of the indication field is used to identify a location of a Terminate codeword in a Terminate block.

Further, to obtain an Ethernet data packet, after the foregoing step 802, the method shown in FIG. 8 may further include the following step:

Step 803: A state machine encoding module 73 in the encoder 700 encodes the encoding result, which is output by the encoding module 72, as an Ethernet data packet and outputs the data packet.

To ensure data boundary correctness after data encoding in a sequence, this embodiment of the present invention uses a sequence (sequence) state machine to perform state machine encoding processing on an encoded block of sequential data. During specific implementation, the state machine encoding module 73 may further encode, by using a jump sequence of the state machine, the encoding result output by the encoding module 72, so as to encode the encoding result as an Ethernet data packet.

Generally, a structure of a data packet in the Ethernet is: packet header s/packet data dddddd/packet trailer t/interframe gap ccccc/packet header s of next packet . . . . A block not in a correct packet sequence is encoded as an error codeword. In this way, an error detection capability can be achieved for encoding, and there is a relatively strong error detection capability especially for a block, whose block type frequently changes, on a packet boundary. According to the foregoing structure of the Ethernet data packet, for example, FIG. 9 shows a schematic diagram of a general encoding state jump of a state machine.

An Ethernet data packet meeting a format requirement can be output according to the state jump shown in FIG. 9, for example:

when in a Data state, if a Data codeword is input, the Data codeword is output, so that the Data codeword is written in a packet data field sequentially in the Ethernet data packet, and the current Data state is kept; and if a Terminate codeword is input, it indicates that a packet trailer is reached, and the Terminate codeword is output, so that the Terminate codeword is written sequentially in the Ethernet data packet, and a Control state is jumped to; and afterward, in the Control state, if a control codeword is input, the control codeword is output, so that the control codeword is sequentially written in a trailer of a previous packet and is used as interframe gap data; if a control codeword is input again, the control codeword is output, so that the control codeword continues to be sequentially written in an interframe location; and if a sop codeword is input, the control codeword is output as a packet header of a next data packet, so as to start a new data packet after the interframe gap data.

In addition, in the Data state, if an error codeword or a sop codeword or a control codeword is input, it does not meet a format requirement of the Ethernet data packet (a next packet header or an interframe gap cannot directly follow Data); therefore, an Error state is jumped to. Similarly, in the Control state, if an error codeword or a data codeword or a terminate codeword is input, it does not meet a format requirement of the Ethernet data packet; therefore, the Error state is jumped to.

According to the foregoing state jump principle, an encoding state machine for the foregoing 256B/257B encoding scheme may be shown in FIG. 10. All conditions are selected from the first 64-bit block and the fourth 64-bit block, and therefore the following jump conditions exist: D, D/T, S/D, D/S, D/C, D/E, T/D, T/S, T/E, T/C, C, E, C/E, and E/C, where D represents Data, T represents a Terminate codeword, S represents a Sop codeword, C represents a Control codeword, and E represents an Error codeword. In addition, all states that include Errors may be considered as Error.

A 256-bit block that includes only one of codewords T0 to T7 corresponds to a same state: D/T. A Default jump condition represented by a dashed arrow in FIG. 10 means that under jump conditions not represented by all solid-line arrows, the state machine automatically jumps to an E state (that is, the Error state).

Figure 11:
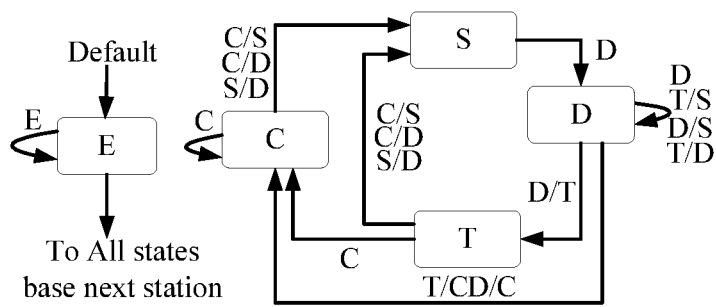
FIG. 11 is a second schematic diagram of a state machine of a 256B/257B encoding scheme according to an embodiment of the present invention.

Further, state combining and simplifying may be performed based on FIG. 10. As shown in FIG. 11, a state C in the figure indicates that jumping to this state a control word may be acquired by encoding according to a condition, S indicates that jumping to this state a packet header Sop may be acquired by encoding according to a condition, D indicates that jumping to this state data may be acquired by encoding according to a condition, T indicates that jumping to this state a packet trailer Terminate may be acquired according to a condition, and E indicates that jumping to this state an error word may be acquired by encoding. The S state and D state may be further combined according to a situation, and an initial state Init may be added to this simplified state machine according to an actual requirement.

Figure 12:
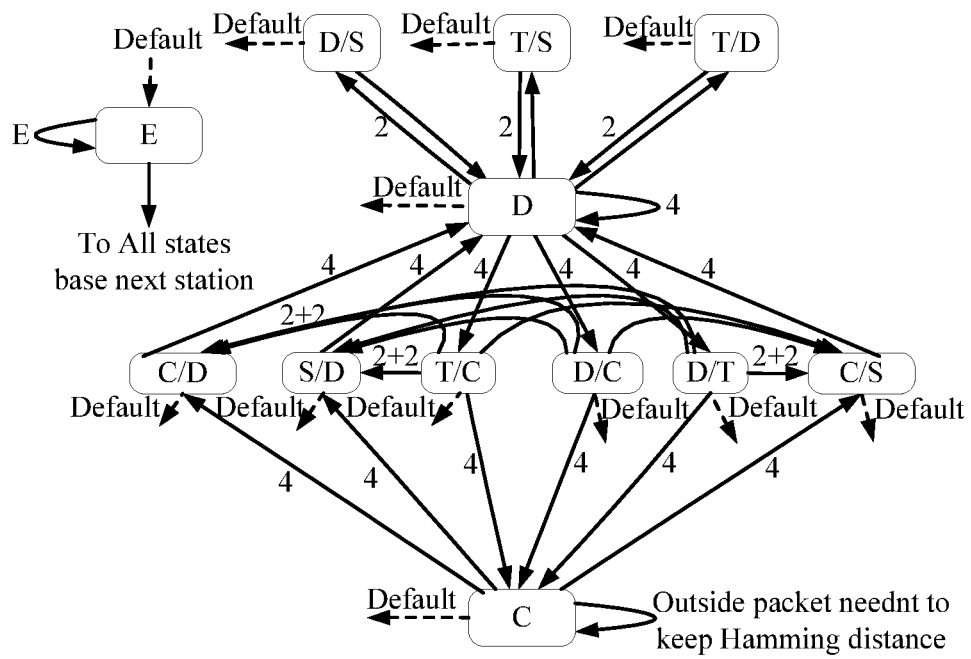
FIG. 12 is a schematic diagram of a state machine of a 256B/258B encoding scheme according to an embodiment of the present invention.

According to the foregoing state jump principle, an encoding state machine for the foregoing 256B/257B encoding scheme may be shown in FIG. 12. Because a 2-bit sync header is used to distinguish data from control information in the 256B/258B encoding scheme, it can be seen from the FIG. 12 of state machine jump that a Hamming distance between encoded codewords is not less than 2.

It can be seen from the foregoing descriptions that the 256B/257B encoding scheme or the 256B/258B encoding scheme provided in this embodiment of the present invention can effectively reduce a delay. Compressing code space in the encoding scheme provided in this embodiment of the present invention can better adapt to a structure of a mainstream RS-FEC algorithm at present. A Hamming distance between all control codewords in 256B/257B encoding or 256B/258B encoding is ensured, and an error detection capability of CRC32 is ensured, thereby meeting a network MTTFPA (Mean Time To False Packet Acceptance, Mean Time to False Packet Acceptance) indicator. In addition, a design of the encoding state machine provided in this embodiment of the present invention is optimized.

Figure 13:
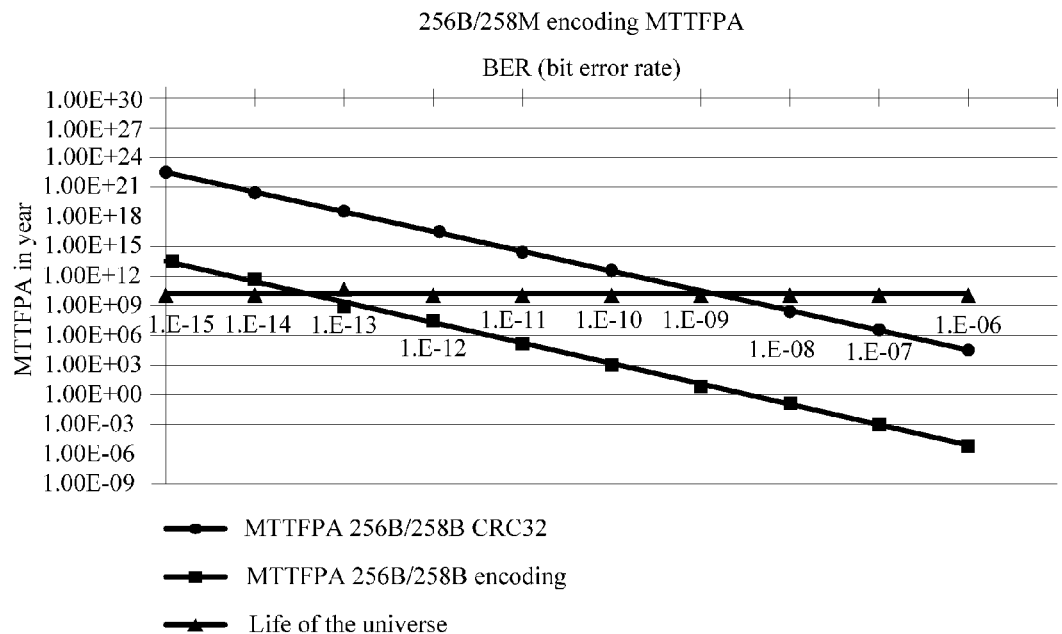
FIG. 13 is a schematic diagram of an MTTFPA indicator of a 256B/258B encoding scheme according to an embodiment of the present invention.

In the 256B/257B encoding scheme provided in this embodiment of the present invention, in a case in which a bit error rate is $10^{-12}$, MTTFPA may reach 1000 years. By means of calculation according to a formula, an MTTFPA indicator in the 256B/258B encoding scheme provided in this embodiment of the present invention may meet a requirement of the current Ethernet, and in a case in which a bit error rate is $10^{-12}$, a time of network MTTFPA reaches $10^{17}$ years. FIG. 13 shows a schematic diagram of an MTTFPA indicator in the 256B/257B encoding scheme.

Figure 14:
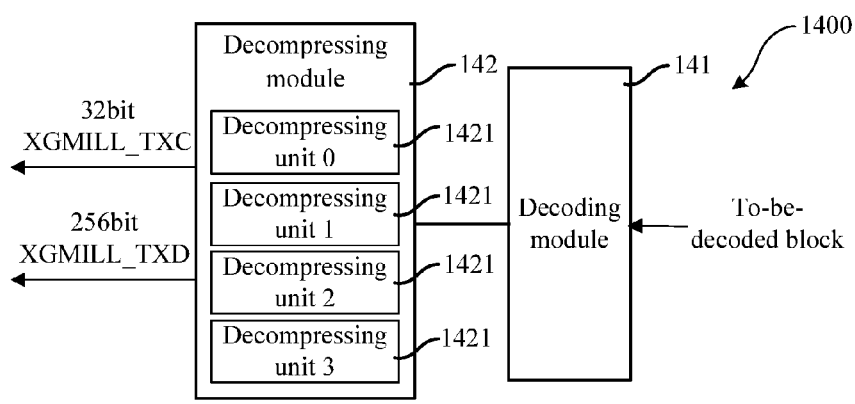
FIG. 14 is a schematic structural diagram of a decoder according to an embodiment of the present invention.

FIG. 14 is a schematic structural diagram of a decoder according to an embodiment of the present invention, where the decoder may be implemented by a logic circuit and is configured to perform a decoding function of the PCS in FIG. 5.

As shown in FIG. 14, the decoder 1400 may include: a decoding module 141 and a decompressing module 142.

After receiving a to-be-decoded block, the decoding module 141 determines a physical layer data format of the to-be-decoded block according to a value of a sync header, a hierarchy of a Block Type Field (block type field), and a value of the Block Type Field of the to-be-decoded block; and acquires, according to the physical layer data format of the to-be-decoded block, a control block and a data block (in a case in which a control block and a data block are included) that are in the to-be-decoded block, and generates an MII control block (MII_TXC for short in the following).

According to the control block acquired by the decoding module 141, the decompressing module 142 may decompress the control block; and output a decompressed control block and the data block, which is in the to-be-decoded block and is acquired by the decoding module, as a 256-bit block (MII_TXD for short in the following), and output the MII_TXD and the MII_TXC generated by the decoding module 141.

MII_TXCs output from an MII are four 8-bit MII_TXCs, MII_TXDs output from the MII are four 64-bit MII_TXDs, and an 8-bit MII_TXC is in a one-to-one correspondence to a 64-bit MII_TXD. Therefore, when decompressed data is output after decompression, four decompressing units 1421 in the decompressing module 142 may perform decompressing and outputting processing on each piece of data.

Figure 15:
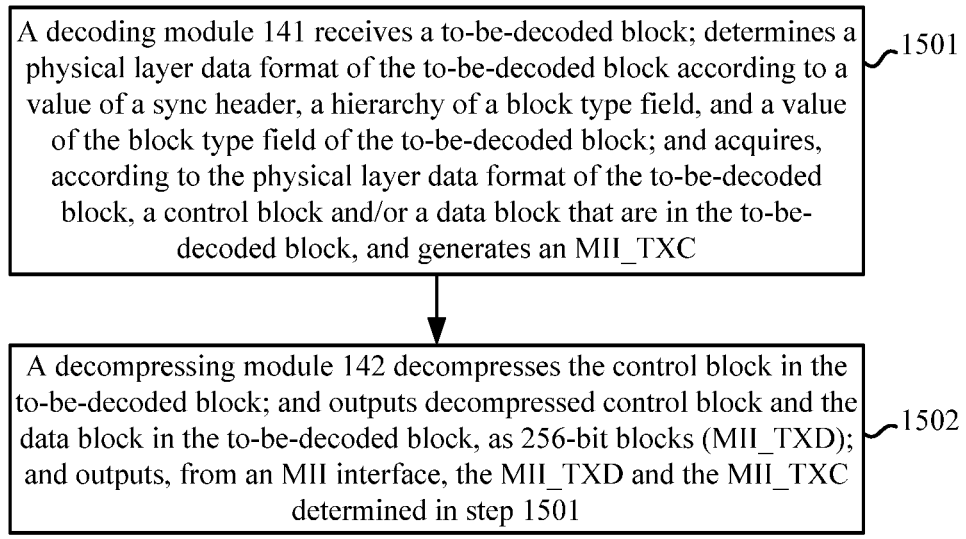
FIG. 15 is a schematic diagram of a decoding process according to an embodiment of the present invention.

With reference to FIG. 15, the following describes in detail an decoding process of the foregoing decoder 1400.

FIG. 15 is a schematic diagram of a decoding process according to an embodiment of the present invention. As shown in the figure, the process may include:

Step 1501: A decoding module 141 of a decoder 1400 receives a to-be-decoded block; determines a physical layer data format of the to-be-decoded block according to a value of a sync header, a hierarchy of a Block Type Field, and a value of the Block Type Field of the to-be-decoded block; and acquires, according to the physical layer data format of the to-be-decoded block, a control block and a data block (in a case in which a control block and a data block are included) that are in the to-be-decoded block, and generates an MII_TXC.

For example, in a specific embodiment, if it is determined that the value of the sync header of the to-be-decoded block is a first value, it is determined that the to-be-decoded block includes a control block; and if the decoding module 141 determines that the value of the sync header of the to-be-decoded block is a second value, it is determined that the to-be-decoded block is an all-data block. For example, for the foregoing 256B/257B encoding and decoding scheme, when a value of a sync header is 0, it indicates that a corresponding 257-bit block includes four 64-bit data blocks, that is, all-data blocks (data blocks); and when the value of the sync header is 1, it indicates that a control block exists in the corresponding 257-bit block. For the foregoing 256B/258B encoding and decoding scheme, when a value of a sync header is 01, it indicates that a corresponding 257-bit block includes four 64-bit data blocks, that is, all-data blocks (data blocks); and when the value of the sync header is 10, it indicates that a control block exists in the corresponding 257-bit block. Similar to the foregoing descriptions, the number of bits in the sync header is not limited in this embodiment of the present invention.

Optionally, further, after it is determined that a control block exists in the 257-bit block, the decoding module 141 may determine the hierarchy of the Block Type Field of the to-be-decoded block according to a value of a first-level Block Type Field of the to-be-decoded block. For example, after the value of the first-level block type field of the to-be-decoded block is acquired, by comparing the value with the values of the Block Type Fields in the encoding format table shown in FIG. 3, FIG. 4, or FIG. 5, the physical layer data format of the to-be-decoded block can be determined. If it is determined, by using the foregoing step, that the to-be-decoded block includes a block type field of one level, it is determined that the to-be-decoded block includes two or less control blocks; and if it is determined that the to-be-decoded block includes at least block type fields of two levels, it is determined that the to-be-decoded block includes three or more control blocks.

Optionally, further, if it is determined that the to-be-decoded block includes a block type field of one level, and it is determined, according to a value of the Block Type Field, that a Terminate block exists in the control block of the to-be-decoded block, the decoding module 141 may determine a location of a terminate codeword in the Terminate block according to the value of the block type field.

Further, if it is determined, according to the physical layer data format of the to-be-decoded block, that the to-be-decoded block further includes an indication field, the decoding module 141 may further determine a location of a Terminate codeword in a Terminate block control block in the to-be-decoded block according to a value of the indication field.

Step 1502: A decompressing module 142 in the decoder 1400 decompresses the control block in the to-be-decoded block; and outputs a decompressed control block and the data block in the to-be-decoded block as a 256-bit block (MII_TXD), and outputs, from an MII, the MII_TXD and the MII_TXC determined in step 1501.

During specific implementation, the decompressing module 142 divides the to-be-decoded block into four to-be-decoded blocks, and each decompressing unit 1421 in the decompressing module 142 decompresses each of the four to-be-decoded blocks in the to-be-decoded block, where if the to-be-decoded block includes eight 7-bit control blocks, each 7-bit control block is decompressed into an 8-bit control block, and if the to-be-decoded block includes a terminate codeword, a sequence codeword, or an sfd codeword, 8-bit space is obtained by decompression.

It should be noted that although the foregoing embodiments of the present invention mainly use the 256B/257B direct encoding and decoding and the 256B/258B direct encoding and decoding as an example for description, the protection scope of the present invention is not limited thereto. For example, based on the foregoing encoding and decoding principles in the embodiments of the present invention, when 4 bits are used as a sync header, an encoding and decoding scheme thereof may be referred to as a 256B/260B encoding and decoding scheme.

In the foregoing embodiments of the present invention, during encoding, a physical layer encoding format, a value of a sync header, a hierarchy of a block type field, and a value of the block type field are determined according to an MII control block, and a precoded to-be-encoded block is mapped to a physical layer data format according to the determined physical layer encoding format, so as to encode a 256-bit block. It can be seen that, in the embodiments of the present invention, by using compressible space of a 256-bit block, it is ensured that a Hamming distance between 256-bit to-be-encoded blocks is not less than 4, and sufficient checksum space can be provided for an RS-FEC algorithm.

Based on a same technical conception, an embodiment of the present invention further provides an apparatus that can implement the foregoing encoding method, where the apparatus may be one of the following apparatuses:

a PHY, where the PHY may be implemented by using an FPGA or an ASIC, the PHY may be a component in a network interface card (Network Interface Card, NIC), the NIC may be a line card (Line Card) or a PIC (Physical Interface Card, physical interface card), and the PHY may include a Media-Independent Interface (media independent interface, MII) for interfacing to (for interfacing to) MAC;

a PHY chip (PHY chip), where the PHY chip may include multiple PHYs, and the PHY chip may be implemented by using an FPGA or an ASIC;

a system chip (system chip), where the system chip may include multiple MACs and multiple PHYs, and the system chip may be implemented by using an FPGA or an ASIC; and a multi-port Ethernet device (multi-port Ethernet device), where the multi-port Ethernet device may be an Ethernet hub, an Ethernet router, or an Ethernet switch, the multi-port Ethernet device includes multiple ports, each port may include a system chip, the system chip may include a MAC and a PHY, the multi-port Ethernet device may further integrate multiple MACs into one MAC chip (MAC chip) and integrate multiple PHYs into one PHY chip, and the multi-port Ethernet device may also integrate multiple MACs and multiple PHYs into one system chip.

The apparatus can perform the encoding method provided in the foregoing embodiments of the present invention, and a specific implementation manner is not described in detail herein again.

Based on a same technical conception, an embodiment of the present invention further provides an apparatus that can implement the foregoing decoding method, where the apparatus may be one of the following apparatuses:

a PHY, where the PHY may be implemented by using an FPGA or an ASIC, the PHY may be a component in a network interface card (Network Interface Card, NIC), the NIC may be a line card (Line Card) or a PIC (Physical Interface Card, physical interface card), and the PHY may include a Media-Independent Interface (media independent interface, MII) for interfacing to (for interfacing to) MAC;

a PHY chip (PHY chip), where the PHY chip may include multiple PHYs, and the PHY chip may be implemented by using an FPGA or an ASIC;

a system chip (system chip), where the system chip may include multiple MACs and multiple PHYs, and the system chip may be implemented by using an FPGA or an ASIC; and a multi-port Ethernet device (multi-port Ethernet device), where the multi-port Ethernet device may be an Ethernet hub, an Ethernet router, or an Ethernet switch, the multi-port Ethernet device includes multiple ports, each port may include a system chip, the system chip may include a MAC and a PHY, the multi-port Ethernet device may further integrate multiple MACs into one MAC chip (MAC chip) and integrate multiple PHYs into one PHY chip, and the multi-port Ethernet device may also integrate multiple MACs and multiple PHYs into one system chip.

The apparatus can perform the decoding method provided in the foregoing embodiments of the present invention, and a specific implementation manner is not described in detail herein again.

In conclusion, in the foregoing embodiments of the present invention, during physical layer encoding, a physical layer encoding format, a value of a sync header, a hierarchy of a block type field, and a value of a block type field of each level are determined according to an MII control block; and a precoded to-be-encoded block is mapped to a physical layer data format according to the determined physical layer encoding format, so as to encode a 256-bit block. Because multi-level block type division is performed according to compressible space of a 256-bit block, it is ensured that a Hamming distance between 256-bit to-be-encoded blocks is not less than 4 in an encoding process, and sufficient checksum space can be provided for an RS-FEC forward error correction algorithm.

The present invention is described with reference to the flowcharts and/or block diagrams of the method, the device (system), and the computer program product according to the embodiments of the present invention. It should be understood that computer program instructions implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device, so that the instructions executed by the computer or the processor of another programmable data processing device can implement a function specified in one or more processes in the flowcharts and/or in one or more blocks in the block diagrams.

These computer program instructions may also be stored in a computer readable memory that can instruct the computer or another programmable data processing device to work in a specific manner, so that the instructions stored in the computer readable memory generate an artifact that includes an instruction apparatus. The instruction apparatus implements a function specified in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

Although some exemplary embodiments of the present invention have been described, persons skilled in the art can make changes and modifications to these embodiments once they learn the basic inventive concept. Therefore, the following claims are intended to be construed as to cover the exemplary embodiments and all changes and modifications falling within the scope of the present invention.

Obviously, persons skilled in the art can make various modifications and variations to the present invention without departing from the spirit and scope of the present invention. In this way, The present invention is intended to cover these modifications and variations to the present invention if these modifications and variations fall within the scope of the claims of the present invention and their equivalent technologies.

What is claimed is:

1. An encoding method, comprising:
    receiving a media independent interface (MII) control block and a first 256-bit to-be-encoded block;
    determining a control block in the first 256-bit to-be-encoded block according to the MII control block, wherein the determined control block is compressed to obtain a compressed to-be-encoded block;
    determining a physical layer encoding format, a value of a sync header, a hierarchy of a block type field, and a value of the block type field according to the MII control block; and
    obtaining an encoding result, the obtaining comprising
        mapping the compressed to-be-encoded block to data in a physical layer data format according to the determined physical layer encoding format,
        adding a sync header to the data, and
        adding, according to the hierarchy of the block type field, a block type field to space obtained by compression, wherein a value of the added sync header is the determined value of the sync header and a value of the added block type field is the determined value of the block type field.

2. The method according to claim 1, wherein the first 256-bit to-be-encoded block comprises four 64-bit to-be-encoded blocks, the MII control block comprises four 8-bit MII control blocks, and the four 8-bit MII control blocks are in a one-to-one correspondence to the four 64-bit to-be-encoded blocks, and wherein the determining the control block in the first 256-bit to-be-encoded block comprises:
    performing the following steps on each to-be-encoded block in the four 64-bit to-be-encoded blocks:
    determining a control block in a 64-bit to-be-encoded block according to corresponding 8-bit MII control block;
    determining if the 64-bit to-be-encoded block comprises eight 8-bit control blocks, wherein each 8-bit control block is compressed into a 7-bit control block if the 64-bit to-be-encoded block comprises the eight 8-bit control blocks.

3. The method according to claim 2, wherein the steps further comprise:
    determining if the 64-bit to-be-encoded block comprises a terminate codeword, a sequence codeword, or an sfd codeword, wherein the 64-bit to-be-encoded block is compressed into a 56-bit block if the 64-bit to-be-encoded block comprises the terminate codeword, the sequence codeword or the sfd codeword.

4. The method according to claim 1, wherein the value of the sync header comprises a first value when the first 256-bit to-be-encoded block comprises a control block, wherein the value of the sync header comprises a second value when the first 256-bit to-be-encoded block does not comprise a control block, and wherein the second value is different from the first value.

5. The method according to claim 1, wherein a block type field of one level is used for the hierarchy of the block type field when the first 256-bit to-be-encoded block comprises N 64-bit control blocks, the method further comprising:
    determining a value of a first-level block type field in the block type field of one level, wherein the value of the first-level block type field is different from a received value of a first-level block type field corresponding to a second 256-bit to-be-encoded block, the second 256-bit to-be-encoded block comprises Y 64-bit control blocks, wherein Y is a positive integer less than 3, and the Y 64-bit control blocks are different from the N 64-bit control blocks in type or location, or control blocks of a same type are different in location.

6. The method according to claim 5, wherein when the first 256-bit to-be-encoded block comprises one terminate-type 64-bit control block (Terminate block) and three 64-bit data blocks, the value of the first-level block type field in the block type field of one level is determined according to a location of a Terminate codeword in the Terminate block.

7. The method according to claim 1, wherein the block type fields of two levels are used for the hierarchy of the block type field when the first 256-bit to-be-encoded block comprises M 64-bit control blocks, wherein M is a positive integer greater than 2 and less than 5, the method further comprising:

determining a value of a first-level block type field in the block type fields of two levels, wherein the value of the first-level block type field is the same as a received value of a first-level block type field corresponding to a third 256-bit to-be-encoded block, and is different from a received value of a first-level block type field corresponding to a fourth 256-bit to-be-encoded block, the third 256-bit to-be-encoded block comprises X 64-bit control blocks, wherein X is a positive integer greater than 2 and less than 5, and the fourth 256-bit to-be-encoded block comprises Z 64-bit control blocks, wherein Z is a positive integer less than 3; and determining a value of a second-level block type field in the block type fields of two levels, wherein the value of the second-level block type field is different from a received value of a second-level block type field corresponding to a fifth 256-bit to-be-encoded block, the fifth 256-bit to-be-encoded block comprises Q 64-bit control blocks, wherein Q is a positive integer greater than 2 and less than 5, the Q 64-bit control blocks are different from the M 64-bit control blocks in type or location, or control blocks of a same type are different in location, and a value of a first-level block type field corresponding to the fifth 256-bit to-be-encoded block is the same as a value of a first-level block type field corresponding to the first 256-bit to-be-encoded block.

8. The method according to claim 5, further comprising:
if it is determined, according to the MII control block, that the first 256-bit to-be-encoded block comprises at least two 64-bit control blocks, and one of the at least two control blocks is a Terminate block, determining a value of an indication field according to a location of a Terminate codeword in the Terminate block, and adding an indication field to space obtained by compression, wherein a value of the added indication field is the determined value of the indication field, and the value of the added indication field is used to identify the location of the Terminate codeword in the Terminate block.

9. The method according to claim 1, wherein a width of the sync header is N bits, and N≥1.

10. An encoder, comprising:
a precoding circuit, configured to receive a media independent interface (MII) control block and a first 256-bit to-be-encoded block that are input, determine a control block in the first 256-bit to-be-encoded block according to the MII control block, and compress the determined control block to obtain a compressed to-be-encoded block; and an encoding circuit, configured to determine a physical layer encoding format, a value of a sync header, a hierarchy of a block type field, and a value of the block type field according to the MII control block, and obtain an encoding result, wherein the obtaining comprises mapping the compressed to-be-encoded block, output by the precoding circuit, to data in a physical layer data format according to the determined physical layer encoding format, adding a sync header to the data, and adding, according to the hierarchy of the block type field, a block type field to space that is obtained by compression by the precoding circuit, wherein a value of the added sync header is the determined value of the sync header, and a value of the added block type field is the determined value of the block type field.

11. The encoder according to claim 10, wherein the first 256-bit to-be-encoded block comprises four 64-bit to-be-encoded blocks, the MII control block comprises four 8-bit MII control blocks, and the four 8-bit MII control blocks are in a one-to-one correspondence to the four 64-bit to-be-encoded blocks, and wherein the precoding circuit comprises four precoding units, and each precoding unit performs the following steps on each to-be-encoded block in the four 64-bit to-be-encoded blocks:

determining a control block in a 64-bit to-be-encoded block according to a corresponding 8-bit MII control block, and compressing the 64-bit to-be-encoded block into a 56-bit block when the 64-bit to-be-encoded block comprises a terminate codeword, a sequence codeword or an sfd codeword.

12. The encoder according to claim 11, the steps further comprising:
compressing each 8-bit control block into a 7-bit control block if the 64-bit to-be-encoded block comprises eight 8-bit control blocks.

13. The encoder according to claim 11, wherein the value of the sync header comprises a first value and wherein when the first 256-bit to-be-encoded block comprises a control block, wherein the value of the sync header comprises a second value when the first 256-bit to-be-encoded block does not comprise a control block, and wherein the second value is different from the first value.

14. The encoder according to claim 11, wherein a block type field of one level is used for the hierarchy of the block type field when the first 256-bit to-be-encoded block comprises N 64-bit control blocks, wherein N is a positive integer less than 3 and wherein encoding circuit is further configured to:

determine a value of a first-level block type field in the block type field of one level, wherein the value of the first-level block type field is different from a received value of a first-level block type field corresponding to a second 256-bit to-be-encoded block, the second 256-bit to-be-encoded block comprises Y 64-bit control blocks, wherein Y is a positive integer less than 3, and the Y 64-bit control blocks are different from the N 64-bit control blocks in type or location, or control blocks of a same type are different in location.

15. The encoder according to claim 11 wherein when the first 256-bit to-be-encoded block comprises one terminate-type 64-bit control block Terminate block and three 64-bit data blocks, the value of the first-level block type field in the block type field of one level is determined according to a location of a Terminate codeword in the Terminate block.

16. The encoder according to claim 11, wherein block type fields of two levels are used for the hierarchy of the block type field when the first 256-bit to-be-encoded block comprises M 64-bit control blocks, wherein M is a positive integer greater than 2 and less than 5, the encoding circuit is further configured to determine a value of a first-level block type field in the block type fields of two levels, wherein the value of the first-level block type field is the same as a received value of a first-level block type field corresponding to a third 256-bit to-be-encoded block, and is different from a received value of a first-level block type field corresponding to a fourth 256-bit to-be-encoded block, the third 256-bit to-be-encoded block comprises X 64-bit control blocks, wherein X is a positive integer greater than 2 and less than 5, and the fourth 256-bit to-be-encoded block comprises Z 64-bit control blocks, wherein Z is a positive integer less than 3; and determine a value of a second-level block type field in the block type fields of two levels, wherein the value of the second-level block type field is different from a received value of a second-level block type field corresponding to a fifth 256-bit to-be-encoded block, the fifth 256-bit to-be-encoded block comprises Q 64-bit control blocks, wherein Q is a positive integer greater than 2 and less than 5, the Q 64-bit control blocks are different from the M 64-bit control blocks in type or location, or control blocks of a same type are different in location, and a value of a first-level block type field corresponding to the fifth 256-bit to-be-encoded block is the same as a value of a first-level block type field corresponding to the first 256-bit to-be-encoded block.

17. The encoder according to claim 14, wherein the encoding circuit is further configured to: if it is determined, according to the MII control block, that the first 256-bit to-be-encoded block comprises at least two 64-bit control blocks, and one of the at least two control blocks is a Terminate block, determine a value of an indication field according to a location of a Terminate codeword in the Terminate block, and add an indication field to space that is obtained by compression by the precoding circuit, wherein a value of the added indication field is the determined value of the indication field, and the value of the added indication field is used to identify the location of the Terminate codeword in the Terminate block.

18. The encoder according to claim 11, wherein a width of the sync header is N bits, and N≥1.

19. A decoding method, comprising:
receiving a first to-be-decoded block having a sync header and a block type field;
determining a physical layer data format of the first to-be-decoded block according to a value of the sync header, a hierarchy of the block type field, and a value of the block type field;
acquiring, according to the physical layer data format, a control block and a data block that are in the first to-be-decoded block;
generating a media independent interface (MII) control block;
decompressing the acquired control block;
outputting a decompressed control block and the acquired data block as a 256-bit block; and
outputting the MII control block.

20. The method according to claim 19, wherein
the first to-be-decoded block comprises the control block when the value of the sync header of the first to-be-decoded block comprises a first value, the method further comprising:
receiving a third to-be-decoded block having a sync header and a block type field;
determining a physical layer data format of the third to-be-decoded block according to a value of the sync header of the third to-be-decoded block, a hierarchy of the block type field of the third to-be-decoded block, and a value of the block type field of the third to-be-decoded block, wherein the third to-be-decoded block does not comprise a control block when the value of the sync header of the third to-be-decoded block comprises a second value, the second value being different from the first value; and
acquiring a data block in the third to-be-decoded block according to the physical layer data format of the third to-be-decoded block.

21. The method according to claim 19, wherein the hierarchy of the block type field of the first to-be-decoded block is determined according to a value of a block type field of one level of the first to-be-decoded block when the first to-be-decoded block comprises the control block.

22. The method according to claim 21, wherein
the hierarchy of the block type field of the first to-be-decoded block is one level, wherein the first to-be-decoded block comprises N 64-bit control blocks, and wherein N is a positive integer less than 3.

23. The method according to claim 21, wherein
the hierarchy of the block type field of the first to-be-decoded block is at least two levels, wherein the first to-be-decoded block comprises M 64-bit control blocks, and wherein M is a positive integer greater than 2 and less than 5.

24. The method according to claim 21, wherein
the hierarchy of the block type field of the first to-be-decoded block is one level, wherein a Terminate block exists in a 64-bit control block in the first to-be-decoded block, and wherein a location of a Terminate codeword in the Terminate block is determined according to the value of the block type field of one level.

25. The method according to claim 19, wherein the first to-be-decoded block further comprises an indication field the method further comprising:
determining a location of a Terminate codeword in a Terminate block control block of the first to-be-decoded block according to a value of the indication field.

26. The method according to claim 19, wherein the decompressing the acquired control block in the first to-be-decoded block comprises:
dividing the first to-be-decoded block into four second to-be-decoded blocks, and separately performing the following steps on the four second to-be-decoded blocks: if the second to-be-decoded block comprises eight 7-bit control blocks, decompressing each 7-bit control block to an 8-bit control block; and if the second to-be-decoded block comprises a Terminate codeword, a sequence codeword, or an sfd codeword, decompressing the second to-be-decoded block to a 64-bit block.

27. The method according to claim 19, wherein a width of the sync header is N bits, and N≥1.

28. A decoder, comprising:
a decoding circuit, configured to
receive a first to-be-decoded block having a sync header and a block type field,
determine a physical layer data format of the first to-be-decoded block according to a value of the sync header, a hierarchy of the block type field, and a value of the block type field,
acquire, according to the physical layer data format, a control block and a data block that are in the first to-be-decoded block, and
generate a media independent interface (MII) control block; and
a decompressing circuit, configured to
decompress the control block acquired by the decoding circuit; and
output a decompressed control block and the data block acquired by the decoding circuit, as a 256-bit block, and output the MII control block generated by the decoding circuit.

29. The decoder according to claim 28, wherein the first to-be-decoded block comprises the control block when the value of the sync header of the first to-be-decoded block comprises a first value, and wherein the decoding circuit is further configured to receive a third to-be-decoded block having a sync header and a block type field, determine a physical layer data format of the third to-be-decoded block according to a value of the sync header of the third to-be-decoded block, a hierarchy of the block type field of the third to-be-decoded block, and a value of the block type field of the third to-be-decoded block, wherein the third to-be-decoded block does not comprise a control block when the value of the sync header of the third to-be-decoded block comprises a second value, the second value different from the first value, and acquire a data block in the third to-be-decoded block according to the physical layer data format of the third to-be-decoded block.

30. The decoder according to claim 28, wherein the hierarchy of the block type field of the first to-be-decoded block is determined according to a value of a block type field of one level of the first to-be-decoded block when the first to-be-decoded block comprises the control block.

31. The decoder according to claim 30, wherein the hierarchy of the block type field of the first to-be-decoded block is one level, wherein the first to-be-decoded block comprises N 64-bit control blocks, and wherein N is a positive integer less than 3.

32. The decoder according to claim 30, wherein the hierarchy of the block type field of the first to-be-decoded block is at least two levels, wherein the first to-be-decoded block comprises M 64-bit control blocks, and wherein M is a positive integer greater than 2 and less than 5.

33. The decoder according to claim 30, wherein the hierarchy of the block type field of the first to-be-decoded block is one level, wherein a Terminate block exists in a 64-bit control block in the first to-be-decoded block, and wherein a location of a terminate codeword is determined in the Terminate block according to the value of the block type field of one level.

34. The decoder according to claim 28, wherein the first to-be-decoded block further comprises an indication field, the decoding circuit is further configured to determine a location of a Terminate codeword in a Terminate block control block of the first to-be-decoded block according to a value of the indication field.

35. The decoder according to claim 28, wherein the decompressing circuit comprises four decompressing units, the decompressing circuit divides the first to-be-decoded block into four second to-be-decoded blocks, and each decompressing unit separately performs the following steps on separate one of the four second to-be-decoded blocks:

if the second to-be-decoded block comprises eight 7-bit control blocks, decompressing each 7-bit control block to an 8-bit control block; and if the second to-be-decoded block comprises a Terminate codeword, a sequence codeword, or an sfd codeword, decompressing the second to-be-decoded block to a 64-bit block.

* * * * *